(12) United States Patent
Callahan

(10) Patent No.: US 8,402,007 B2
(45) Date of Patent: Mar. 19, 2013

(54) METHODS AND APPARATUS FOR CREATING AND UTILIZING TEMPLATES IN CONNECTION WITH INFORMATION MODELING

(75) Inventor: Sean M. Callahan, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 244 days.

(21) Appl. No.: 12/266,846

(22) Filed: Nov. 7, 2008

(65) Prior Publication Data

US 2009/0070368 A1  Mar. 12, 2009

Related U.S. Application Data

(63) Continuation-in-part of application No. 11/459,975, filed on Jul. 26, 2006, now Pat. No. 8,275,799.

(60) Provisional application No. 60/704,631, filed on Aug. 2, 2005.

(51) Int. Cl.
*G06F 17/30* (2006.01)
*G06F 17/00* (2006.01)

(52) U.S. Cl. .............. 707/694; 707/803; 707/999.101

(58) Field of Classification Search .............. 707/694, 707/829, 999.1, 999.101, 999.006, 803, 999.102; 715/243

See application file for complete search history.

(56) References Cited

U.S. PATENT DOCUMENTS

| | | | |
|---|---|---|---|
| 5,119,307 A | 6/1992 | Blaha et al. | |
| 5,121,330 A | 6/1992 | Blaha et al. | |
| 5,710,635 A * | 1/1998 | Webster et al. | 358/296 |
| 6,047,283 A | 4/2000 | Braun | |
| 6,065,010 A | 5/2000 | Otsuka et al. | |
| 6,260,068 B1 * | 7/2001 | Zalewski et al. | 709/226 |
| 6,278,452 B1 | 8/2001 | Huberman et al. | |
| 6,647,508 B2 | 11/2003 | Zalewski et al. | |
| 6,839,714 B2 | 1/2005 | Wheeler et al. | |
| 7,038,677 B2 | 5/2006 | Callahan | |
| 7,085,776 B2 | 8/2006 | Callahan | |
| 7,124,275 B2 | 10/2006 | Gammel et al. | |
| 7,483,944 B2 | 1/2009 | Parupudi et al. | |
| 7,730,498 B2 * | 6/2010 | Resnick et al. | 715/255 |
| 7,877,238 B2 | 1/2011 | Watanabe et al. | |
| 7,882,132 B2 | 2/2011 | Ghatare | |
| 2002/0016892 A1 | 2/2002 | Zalewski et al. | |
| 2003/0204527 A1 | 10/2003 | Callahan | |
| 2004/0176905 A1 | 9/2004 | Sanqunetti et al. | |

(Continued)

FOREIGN PATENT DOCUMENTS

| | | |
|---|---|---|
| EP | 1447760 A2 | 8/2004 |
| EP | 1507223 A1 | 2/2005 |

(Continued)

OTHER PUBLICATIONS

International Search Report for PCT/US2006/029899; Feb. 2, 2007; 12 pages.

(Continued)

*Primary Examiner* — Marc Filipczyk
(74) *Attorney, Agent, or Firm* — Yee & Associates, P.C.

(57) ABSTRACT

Methods and apparatus for information modeling, such as product modeling, are described. In one specific embodiment, a system for capturing product information includes a product definition tree representing permitted elements of a generalized product structure, a plurality of template trees and a plurality of configuration trees. Each template tree represents a product design structure variant which represents a subset of said product definition tree. Each configuration tree represents a particular design configuration, which is constrained to implement the structure of its associated template tree.

5 Claims, 20 Drawing Sheets

U.S. PATENT DOCUMENTS

| | | |
|---|---|---|
| 2005/0015378 A1 | 1/2005 | Gammel et al. |
| 2005/0060329 A1 | 3/2005 | Watanabe et al. |
| 2005/0080792 A1 | 4/2005 | Ghatare |
| 2005/0080800 A1 | 4/2005 | Parupudi et al. |
| 2005/0165807 A1 | 7/2005 | Srinivasan et al. |
| 2006/0122967 A1* | 6/2006 | Purkayastha et al. ............ 707/2 |

FOREIGN PATENT DOCUMENTS

| | | |
|---|---|---|
| WO | WO2007016551 | 2/2007 |

OTHER PUBLICATIONS

Wongvasu, N. et al.; Representing the Relationship Between Items in Logical Bill-of-Material to Support Customers' Request for Quotation for Make-to-Order Products; 2000; pp. 72-85; Proceedings of vol. 4192.

Wongvasu, N. et al.; Trie Representation for Expressing the Compatibility Between Items in a Logical Bill of Material Structure; 2001; pp. 84-90; Proceeding of vol. 4565.

Fouda, P.. et al.; A Heuristic o Generate a Precedence Graph Between Components for a Product Family; May 2001; pp. 43-48; Proceedings of the 4th International.

Shah, "Assembly Modeling as an Extension of Feature-Based Design," 1993, Research in Engineering Design, vol. 5, pp. 218,237 (Cited by examiner Aug. 17, 2012 in related U.S. Appl. No. 11/459,975).

Callahan, "Extended Generic Product Structure: An Information Model for Representing Product Families," Journal of Computing and Information Science in Engineering, vol. 6, Sep. 2006, pp. 263-275.

Response to Final Office Action filed with Request for Continued Examination dated Feb. 18, 2009 for U.S. Appl. No. 11/459,975, 19 pages.

USPTO Final Office Action dated Oct. 7, 2009 for U.S. Appl. No. 11/459,975, 30 pages.

USPTO Final Office Action dated Nov. 18, 2008 for U.S. Appl. No. 11/459,975, 21 pages.

USPTO Office Action dated May 2, 2008 for U.S. Appl. No. 11/459,975, 38 pages.

USPTO Final Office Action dated Jul. 8, 2011 for U.S. Appl. No. 11/459,975, 18 pages.

USPTO Office Action dated Dec. 14, 2010 for U.S. Appl. No. 11/459,975, 23 pages.

USPTO Office Action dated May 1, 2009 for U.S. Appl. No. 11/459,975, 27 pages.

USPTO Office Action dated Jun. 3, 2010 for U.S. Appl. No. 11/459,975, 24 pages.

Response to Final Office Action dated Jan. 7, 2010 for U.S. Appl. No. 11/459,975, 17 pages.

Response to Final Office Action dated Sep. 9, 2011 for U.S. Appl. No. 11/459,975, 15 pages.

Response to Office Action dated Apr. 13, 2011 for U.S. Appl. No. 11/459,975, 16 pages.

Response to Office Action dated Jul. 15, 2009 for U.S. Appl. No. 11/459,975, 18 pages.

Response to Office Action dated Aug. 13, 2008 for U.S. Appl. No. 11/459,975, 12 pages.

Response to Office Action dated Aug. 31, 2010 for U.S. Appl. No. 11/459,975, 18 pages.

Callahan, "Model for Managing Variations in a Product Structure for a Product," U.S. Appl. No. 13/585,664, filed Aug. 14, 2012, 155 Pages.

\* cited by examiner (Legends for Figures 9-17)

METHODS AND APPARATUS FOR CREATING AND UTILIZING TEMPLATES IN CONNECTION WITH INFORMATION MODELING

CROSS-REFERENCE TO RELATED APPLICATIONS

This application is a Continuation-In-Part of U.S. patent application Ser. No. 11/459,975 filed Jul. 26, 2006, which claims the benefit of Provisional Patent Application Ser. No. 60/704,631, filed Aug. 2, 2005, both of which are hereby incorporated by reference in their entirety.

BACKGROUND OF THE INVENTION

This invention relates generally to information models that support sharing of data between design variants within a family, e.g., within a product family, and more particularly, to sharing design data between completely configured variants of the product family using an occurrence model. The model addresses, for example, capturing hierarchical designs made of nodes that can be defined as in-place or as instances of other reusable designs, and applies to any domain involving hierarchical reusable designs.

Information models, sometimes referred to herein as data models, are increasingly utilized in design and manufacture of a wide variety of products, structures and facilities. As the complexity and variants of a particular product, structure or facility design increase, such modeling can provide numerous benefits, including facilitating design and manufacturing efficiency.

For example, highly complex products, structures or facilities like aircraft, ships, off-shore oil drilling platforms and computational genomic structures are typically constructed using hundreds or thousands of mechanical, electrical and other assemblies, which in turn are comprised of numerous individual components or sub-assemblies. Collecting and managing data, in the form of data models, about such assemblies facilitates streamlining the design and manufacturing process of the product, structure or facility. Having such data also facilitates designing variants, improvements, and additional subsystems.

In addition, capturing such data facilitates a virtual product designing process. Designing and testing a product in a virtual environment (e.g., on a computer) facilitates reducing highly expensive physical prototyping and testing of the product. Virtual product design environments can save significant costs and time required for designing a given product, machine or facility.

Even things such as documents and Powerpoint presentations, which have many variations that share significant content, could be modeled using the concepts described herein, in order to eliminate any duplicated data that would currently exist between all the variant documents.

In creating such a data model, having a minimal number of objects to capture design variants facilitates both management of the data as well as scalability of the model. For example, and for even a modest complexity product design, the model typically includes numerous objects. If each product variant requires nearly complete duplication of the model, then the number of objects significantly increases. As one example, there is a family of 747® aircraft with a number of variants, including a passenger 747® aircraft and a cargo 747® aircraft. Capturing each variant design within the family in an efficient manner with a minimal number of additional objects for each variant facilitates designing additional variants, improvements, and additional subsystems.

In addition to managing an arbitrary number of assembly design variations with a fixed assembly structure, managing control of assembly configurations in the presence of assembly structure variations further facilitates designing additional variants, improvements, and additional subsystems. Also, distinguishing between structural variations and configuration variations within a fixed structure facilitates avoiding data duplication and data sharing between variations. When a common design change is made to a design with numerous structural variations, such assembly-configuration-control facilitates avoiding duplicate work and errors.

Bills of material (BOM) have been used to capture "product structure". With such BOMs, however, it is extremely difficult, especially for complex products, to directly capture each variant in an efficient manner. In addition, and as used herein, the term "product structure" includes not only the product structure in the sense of a bill of material, but also domains including logical system design, geometric CAD design, manufacturing assembly sequence and any other domain where capturing hierarchical designs, with reusable and nonreusable components, is a useful design capture approach. Here, the term "product structure" is not limited to the traditional part list in a BOM. Instead it is a "generalized product structure," which applies to multiple design domains, and carries a much richer set of information than does a standard BOM/product structure. A generalized product structure captures and shares design data between product family member designs with both configuration and product structural variations. It also captures and shares design content between versions of the design of a single product family member.

A data model to capture a generalized product structure should support making the user aware of permitted product design configurations which consist of required component configurations. For example, each permitted configuration includes a certain number of specific logical components, which specifies that no greater or fewer than that number of component and link configurations are allowed. Links between components are just represented as another type of component. Capturing the required components and their permitted configurations not only assists in creating the generalized product structure, but also facilitates readily identifying potential errors of omission or commission. For example, if a particular component or link is missing from a particular product configuration, or if a link is included improperly, these errors could be readily identified and avoided.

SUMMARY

One aspect of a system for capturing product information is described. The system includes a product definition tree representing permitted elements of a generalized product structure, including definition usage and occurrence objects. The system also includes a plurality of template trees. Each template tree represents a product design structure variant, which represents a subset of the product definition tree. Each template tree includes a plurality of definition template, usage template and occurrence template objects, and those objects are shared among the plurality of template trees. Each template object is linked to one product structure object by an implements link.

In another aspect, a system for capturing product information is described. The system includes a product definition tree and a plurality of template trees. Each template tree is associated with the product tree and represents a product design-structure variant which contains elements that implement a subset of the product definition tree. The system further includes a plurality of configuration trees. Each configuration tree is associated with, and implements the structure of, one of the template trees. Each template tree defines the permitted structure of its associated configuration tree. Each configuration tree includes a plurality of definition configuration, usage configuration and occurrence configuration objects, and those objects are shared among the plurality of configuration trees. Each template object is linked to one template object by an implements link.

DETAILED DESCRIPTION OF THE INVENTION

Set forth below is a detailed description of an information model that facilitates and supports sharing product data between designs of completely configured variants of a product family. Such sharing of data facilitates utilizing a minimal number of objects in modeling all variants and therefore enhances scalability.

Figure 1:
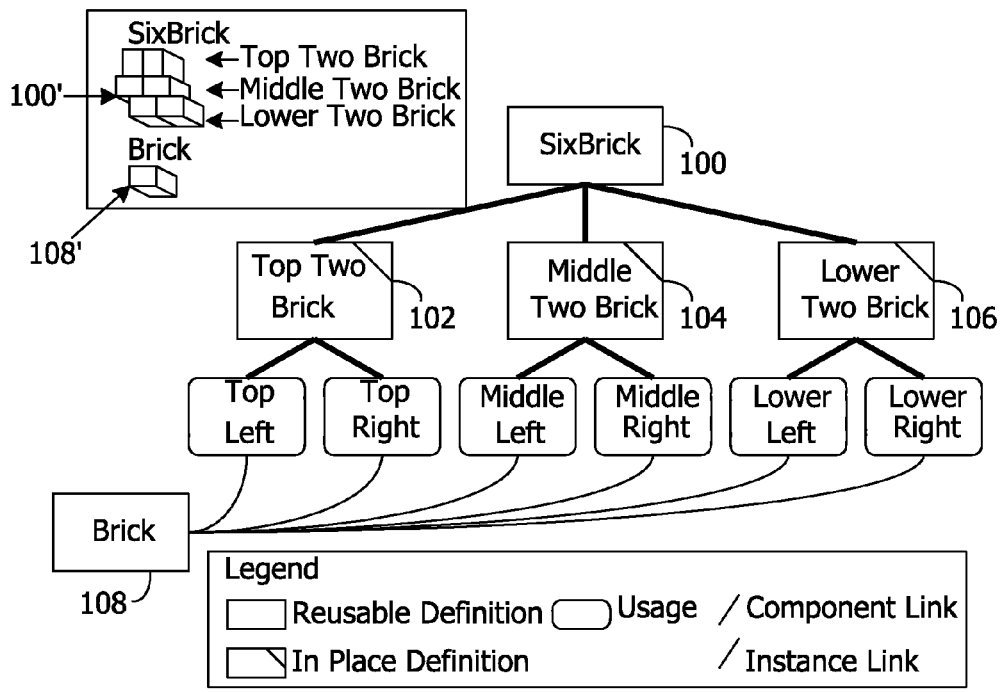
FIG. 1 is a schematic drawing of a six brick assembly product structure, with no template tree and no configuration tree. It illustrates the use of reusable and in-place definitions in a product structure definition tree, with usage (authored assembly instance) objects, but no occurrence objects.
Figure 2:
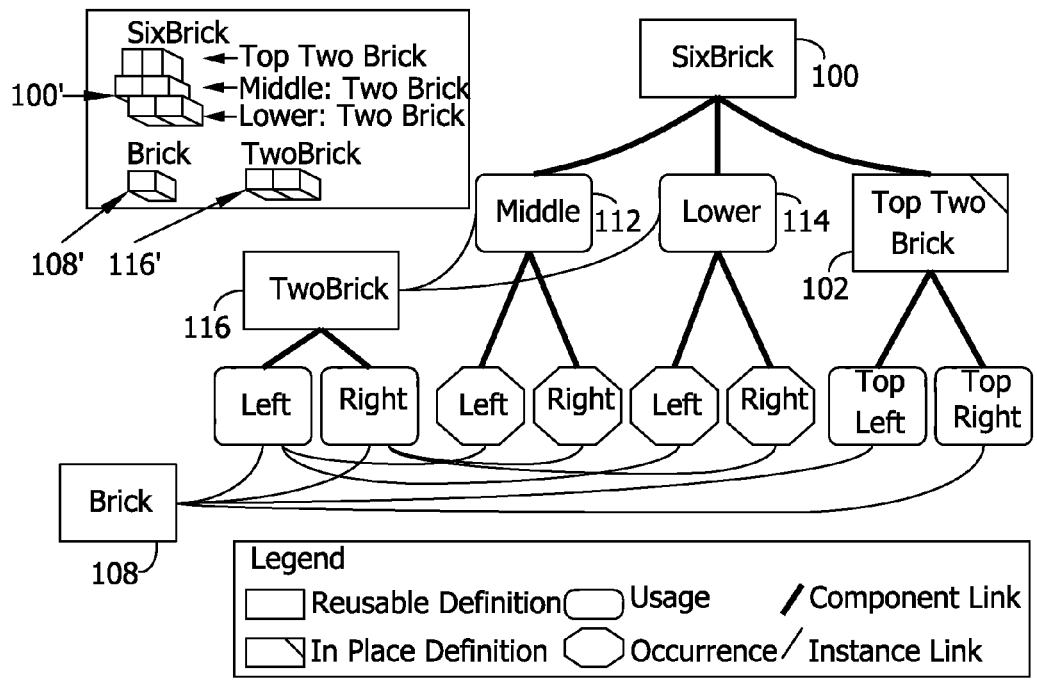
FIG. 2 is an alternative design of the same six brick assembly shown in FIG. 1, which incorporates a reusable assembly, and contains occurrence (derived assembly instance) objects.
Figure 3:
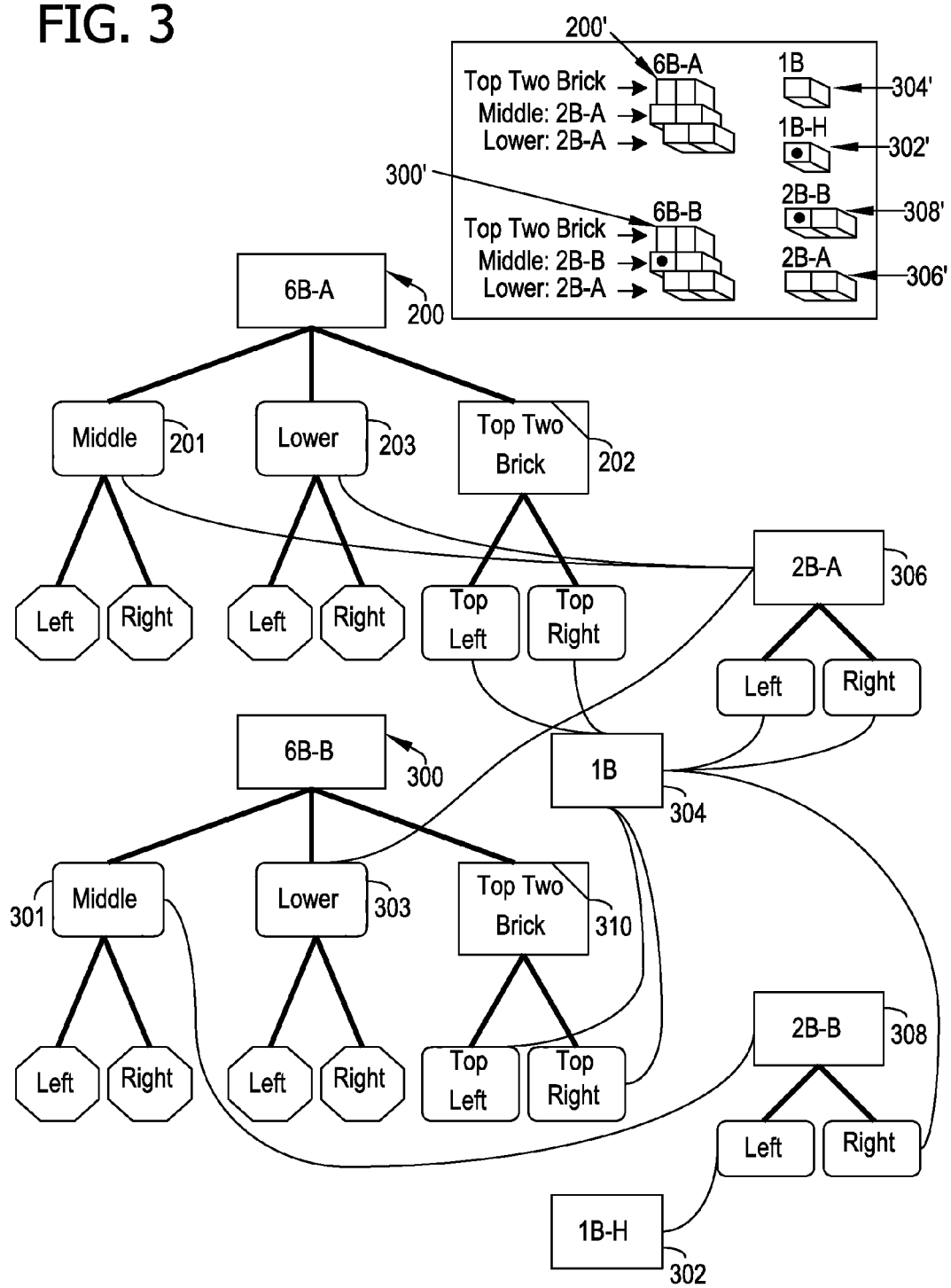
FIG. 3 illustrates two designs based on the six brick assembly shown FIG. 2, where one of the two designs has a brick with a hole.

More particularly, FIGS. 1-3 set forth a basic modeling example in connection with a brick assembly, which has no design variations. An Extended Generic Product Structure (EGPS) data model then is described herein in connection with FIGS. 4-18. This data model is not limited to geometric assemblies, and can apply to any type of reusable and in-place design structures. For example, EGPS could be used to capture families of abstract system designs, presentation slides, or manufacturing assembly plans. A Generalized Extended Generic Product Structure Model is then described in connection with FIGS. 19-25. They include, in comparison to the EGPS, classes that are used to define a different and additional type of tree structure—Definition Template, Usage Template, and Occurrence Template. Generally, the Template tree structure constrains permitted configuration tree structures, and specifies definition tree objects that are implemented by each template tree structure.

With respect to EGPS, EGPS can be implemented in many different forms. For example, EGPS can be implemented on a personal computer programmed to facilitate generation of the model structure described herein. Alternatively, EGPS can be implemented on a server or on any device capable of being programmed to enable input and/or storage of such model.

A subset of EGPS is referred to as "Single Variant Product Structure" (SVPS) provides the following features: 1) combining in-place designs and design instances in one hierarchical structure; and 2) having multiple subtypes of common definition objects in one design hierarchy to completely capture a design from a certain perspective.

As used herein, the terms "object" and "class instance" refer to the UML/programming meaning of instance. In class modeling there is a distinction between a class definition, as described in UML class diagrams, and an instance of such a class that might be created in a database or the memory of a computer, or as might be shown in a UML instance diagram. Otherwise "instance" is used to describe an instance of one design definition as a child component of another design definition. This is applicable to any case where there may be multiple instances of one definition as a component of another.

Instantiation is an operation that has been implemented in many different CAD applications and is well-known to the state of the art as a solution to the problem of managing a common definition that is used many places. Instantiating an assembly creates an instance tree whose structure is an identical structure to the original and which is linked back to the original assembly. Changes can thus be automatically propagated from a definition tree to all instances of it.

An assembly, as commonly understood, is an aggregation of the component parts of a mechanism, machine or a device. More generally, in the context of this invention, an "assembly" is defined as a general, aggregate design that is composed of instances (or uses) of other independent designs and also in-place child definition components. The only constraint is that any assembly can never be a child of itself at any level of assembly definition. Components have various characteristics (e.g., shape, size, strength, materials) that vary depending upon design domain.

The fundamental EGPS class is "definition." A definition object can represent the design of a single indivisible unit or the design of an assembly of arbitrary complexity. A definition object representing an assembly of multiple components is the root node of a "definition tree" (or product tree) in which there is a node for each component and for each subassembly that would be included if that design were created. Alternatively, the tree may consist of only that root definition object; it is a definition tree with only one definition node. As used herein, the terms "node", "object" and "class instance" are synonyms.

Definition objects can have two states: reusable or in-place. A "reusable definition" has no parent definition, and instances of it can be created as child components of other definitions. An "in-place definition" is a child component of a parent definition and cannot be instantiated on a parent reusable definition. A "usage" is a class of objects that are instances of reusable definitions.

An "occurrence" is an instance that is very similar to a usage but is derived, rather than authored. When a usage is created to represent an instance of a reference assembly, occurrences are automatically created as children of the usage to represent instances of all of the reference assembly's child components.

EGPS adds three classes, each a configuration class of the previously introduced SVPS classes of definition, usage and occurrence. The SVPS classes are collectively referred to as "Master Classes" and the added three classes are referred to as "Configuration Classes." The added three classes are "definition configuration," "usage configuration" and "occurrence configuration," respectively. Each Configuration Class object represents a configuration of one, and only one, Master Class object. Thus, the configuration objects each implement their master object.

Just like a definition, a definition configuration object has two states: (a) it can be "reusable," in which case it is a configuration of a reusable design and has no parent definition; or (b) it can be "in-place," in which case it is a configuration of an in-place definition and may be included as a component of multiple definition configurations, but cannot be instantiated by a usage. There are two classes representing instances of reusable definition configuration trees.

A "definition usage configuration" is a configuration of the usage it implements. It may be included as a child of multiple definition configurations, which is a mechanism for sharing content between configurations.

An "occurrence configuration" is a configuration of one, and only one, occurrence. It may be included as a child of multiple usage configurations or of multiple occurrence configurations. Just like an occurrence, it is a derived object, created automatically when a usage configuration instantiates an assembly.

Each configuration object is subordinate to its master object. If the master object is deleted, the configuration object must also be deleted. Thus, a master object owns its configurations.

With respect to modeling a product, each product has a product structure usually associated with a hierarchical bill of materials and geometric structure. Since any other domain with reusable and in-place definitions also has a completely analogous product structure, the term product structure also describes these generalized product structures. More specific synonyms for these generalized product structures are given by the terms definition tree and product tree.

An example of EGPS is set forth in FIG. 1. The example references a "SixBrick" assembly (100'). Any form of element, component or subassembly could be used in place of the SixBrick assembly. More particularly, FIGS. 1-3 illustrate a subset of EGPS called "Single Variant Product Structure" (SVPS). Referring to FIG. 1, a definition tree for the SixBrick structure 100' is shown.

Here a reusable assembly definition, SixBrick (100), represents the SixBrick assembly (100') and is composed of three in-place definitions: Top Two Brick (102), Middle Two Brick (104) and Lower Two Brick (106), each with a left and a right usage component. All six usages —Top Right, Top Left, Middle Right, Middle Left, Lower Right and Lower Left— are instances of one Brick (108') whose design is represented by reusable definition: Brick (108). The instance links connect the usages (instances) to the definition being instantiated.

While this design approach accurately captures the SixBrick assembly design, it has certain limitations. First, the design intent—to have identical shape for the Middle (104) and Lower (106) brick assemblies—is not enforced by the design. Since the left and right usages in Middle Two Brick (104) and Lower Two Brick (106) are all independently authored, their relative positions can be different in one assembly versus the other. This is addressed in the design of FIG. 2 by adding a reusable two-brick assembly, TwoBrick (116). The second issue is limited scalability of the design when the number of bricks in each subassembly is increased. This scalability issue will be detailed after the design approach of FIG. 2 is described.

In FIG. 1, all of the objects would be specified (authored) directly by the user, mediated by a user interface. The new design of FIG. 2 involves creating instances of an assembly, which necessitates the addition of one more class, called "occurrence," shown as an octagon in FIG. 2. An occurrence is an instance that is similar to usage, but is derived, rather than authored. When a usage is created as an instance of an assembly, then the usage gets child occurrences that are automatically created as instances of the assembly's children.

In FIG. 2, SixBrick assembly 100 is still decomposed into three components: Top Two Brick (102) remains the same in-place design; and Middle Usage (112) and Lower Usage (114) are instances of reusable definition TwoBrick (116), replacing definitions Middle Two Brick (104) and Lower Two Brick (106), from FIG. 1, respectively. Reusable definition TwoBrick (116) uniquely defines the relative positions of the Left and Right Brick usages for both instances (112, 114). Two Brick (116) is the design capturing the assembly 1116'.

Instantiating the reusable TwoBrick design twice (i.e., via usages 112 and 114) eliminates the ambiguity of the relative positions of left and right brick instances in each assembly. The second shortcoming is apparent if the number of bricks in each assembly were to be greatly increased, in which case using multiple instantiations of a reusable design would greatly reduce the number of design objects that the user would have to explicitly create. To appreciate the benefit of these enhancements, consider replacing the TwoBrick assembly with a OneHundredBrick assembly. In this case, the following observations would hold.

Using the design approach of FIG. 1, a designer would author two subassemblies, each with 100 independent usages, for a total of 200, plus the two in-place definitions to capture the lower and middle brick assemblies. That is a total of 202 authored items.

Using the design approach of FIG. 2, a designer would create a single OneHundredBrick assembly, plus its 100 component usages, plus two more usages to create instances of it on the parent assembly. This is a total of 103 authored items.

Realistic assemblies may have hundreds or thousands of components; and so the savings, in practical terms, is very significant in reduced designer effort and reduced risk of human error. To summarize, FIG. 2 presents a modeling methodology and design that offers even better scalability and less design ambiguity than the methodology of FIG. 1 by using introducing a reusable definition.

Referring to FIG. 3, SVPS is used to capture the design of a SixBrick product "family" consisting of two design variations: (a) an assembly of six bricks (200') identical to assembly 100' from FIG. 1; and (b) an assembly (300') where the left middle brick has a hole in it.

In FIG. 3, this family is modeled by renaming the original SixBrick assembly (100'), 6B-A (200'), and using the design approach of FIG. 2 to represent the design. This involves adding a second reusable brick definition 1B-H (302) to represent the brick with a hole (302'). The reusable Brick (304') is renamed to 1B and represented by design 304. TwoBrick (116) from FIG. 2, is renamed to 2B-A (306') and presented by definition 306. A second two brick assembly with a hole called 2B-B (308') is represented by reusable definition 308'. Finally, the variant six brick assembly with the hole is represented by the reusable definition 6B-B (300).

There are two distinct SixBrick assembly definition trees, represented by 6B-A (200) and 6B-B (300), each with one in-place definition (202, 310), and each with two instances of either 2B-A (306) (instances 201, 203, 303), or 2B-B (312) (instance 301).

The SVPS model of FIG. 3, while reducing redundancy of various subassemblies and components, does not allow sharing of common components between these two variations of SixBrick, despite the fact that 6B-A (200) and 6B-B (300) actually have two common components, Top Two Bricks (components 202 and 310) and Lower 2B-A (components 203 and 303), and only one distinct component, Middle (components 201 and 301). All three components are represented by distinct objects in each assembly. Only the reusable definitions, 2B-A (306) and 1B (304), are shared between the two six-brick designs: (200) and (300).

Since the identical components "Top Two Brick" (202 and 310) and Lower 2B-A (203 and 303) are distinct objects, it is ambiguous as to whether, from a computer-sensible standpoint, they actually have identical meaning. This illustrates how the duplication of design tree components between the variant designs significantly reduces the level of design sharing, while simultaneously increasing database size and reducing the information content.

It should be noted that Top Two Bricks (209 and 310) has been intentionally modeled as an in-place definition. This is because there are times when an assembly will only be used once per product and is specialized to the particular product family. It would be less desirable to represent it as a reusable definition since that might imply that it makes sense to instantiate it multiple times.

Figure 4:
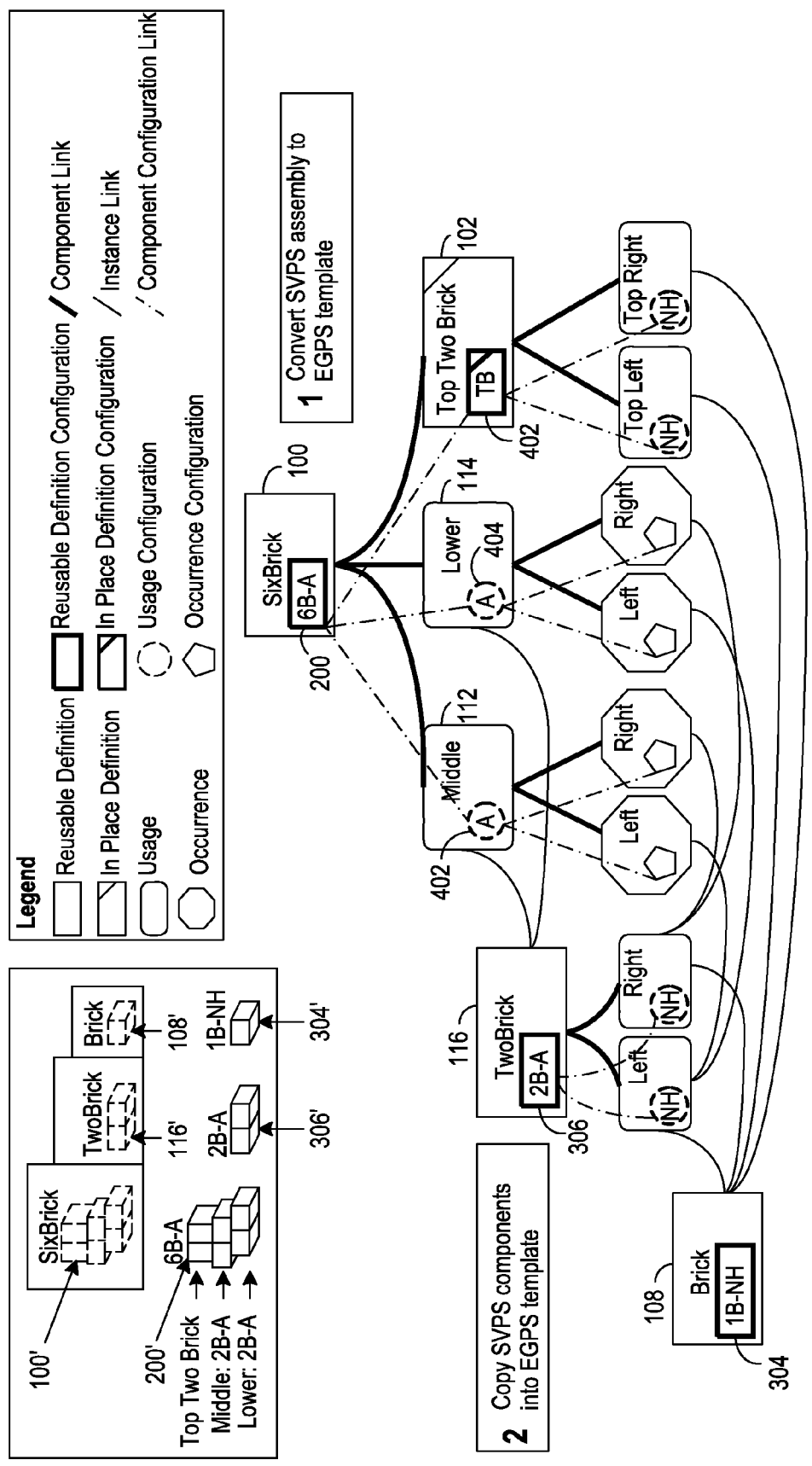
FIG. 4 illustrates a multivariant definition tree illustrating the use of reusable and in-place definition configurations, as well as usage and occurrence configurations, in an Extended Generic Product Structure (EGPS, but not GEGPS).

In the following EGPS instance diagrams, the configuration objects are shown as contained within their master objects to more easily visualize the implements relationship. In FIG. 4, the EGPS approach will be illustrated that allows such in-place definitions to be shared without implying that it is a generally reusable and instantiable design.

The SVPS design of FIG. 2 is reinterpreted as a product family architecture, which acts as a template that must be filled in to create a configuration of the SixBrick assembly design. The architecture definition tree is called the "master definition tree."

A configuration is added (in FIG. 4) that represents the original assembly within the confines of the architectural template. The assembly names introduced in FIG. 3 are used for the configuration objects. The correspondence between the object names in the SixBrick assembly of FIG. 2, and the 6B-A assembly (200') of FIG. 3, is the same as the correspondence between the master object names and configuration object names in FIG. 4. This is achieved by adding a configuration object to every master object. Essentially, there are two parallel assembly structures, with the 6B-A configuration tree (400) imbedded in the SixBrick master definition tree (200).

In FIG. 4, letters are shown in the usage configuration objects (e.g., 402, 404) to indicate which definition configuration objects they instantiate, instead of drawing more explicit lines on the diagram. For example, the usage configuration (402), in the Middle usage (112), has the letter "A," indicating that it is an instance of the 2B-A definition configuration (306) of the TwoBrick assembly (116). The same applies for Lower usage configuration (404) in the Lower usage (114). The Top Two Bricks assembly is presented as an in-place definition 102 having an in-place definition configuration 402. Reusable definition configuration (306) is used to denote assembly 2B-A (306'), which is instantiated by both the Middle (402) and Lower (404) usage configurations. Note that each usage configuration may only instantiate a definition configuration of the definition instantiated by their master usage. Because Middle usage (402) is an instance of Two Brick (116), its usage configuration (402) must be an instance of definition configuration 2B-A (306). If some other definition configurations were added to Two Brick, other Middle usage configurations could be made instantiating them.

Figure 5:
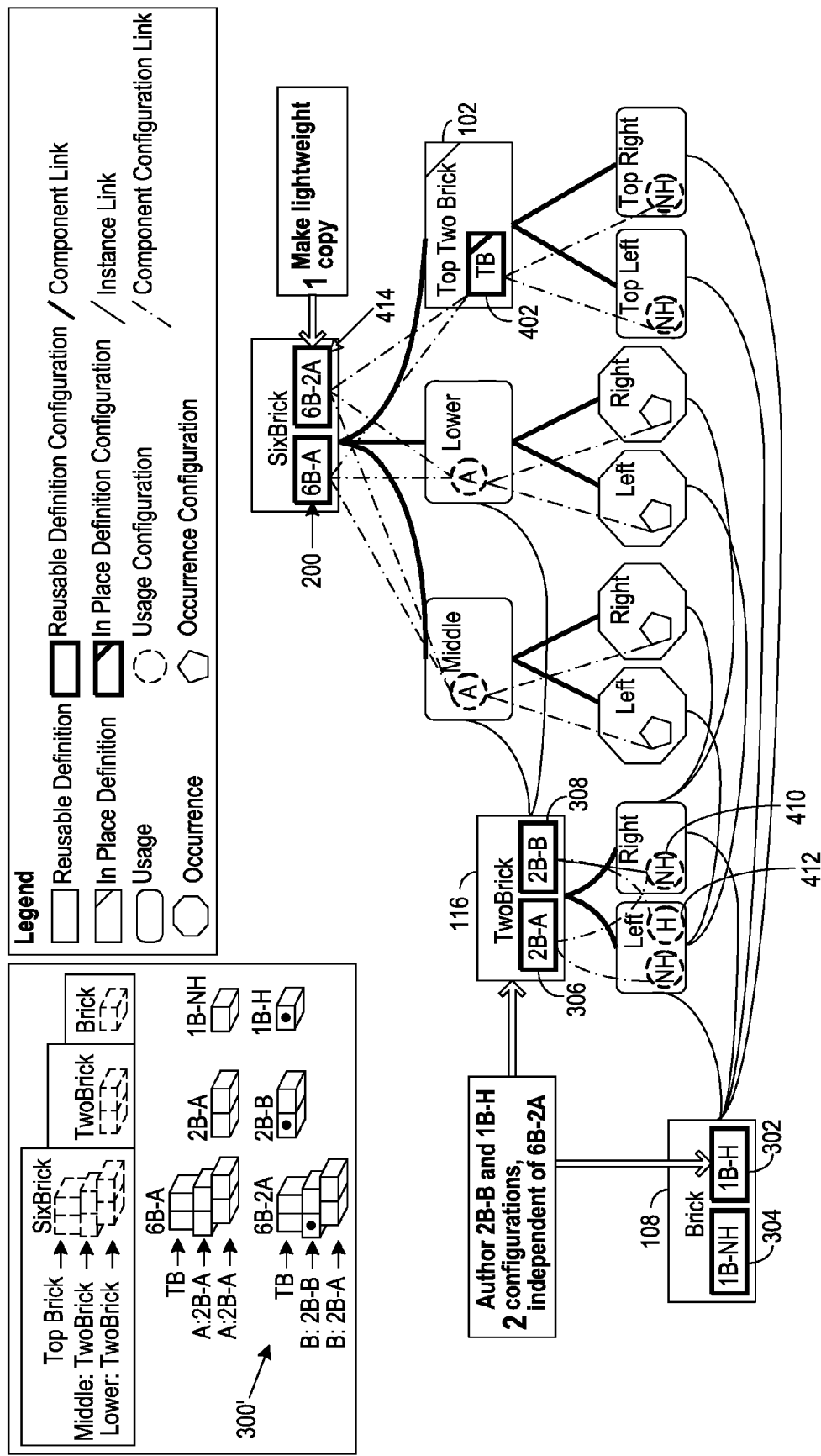
FIG. 5 illustrates a multivariant definition tree with a lightweight copy of one of the SixBrick assembly configuration in FIG. 4, while also adding variations of the TwoBrick assembly, in an EGPS.

Next, referring to FIG. 5, it will be illustrated how to make an assembly configuration that is a lightweight copy of the 6B-A SixBrick, while also adding a second configuration to both Brick—1B-H (the brick with a hole)—and TwoBrick—2B-B, which includes an instance of the brick with a hole.

In FIG. 5, note that only the 6B-2A reusable definition configuration object (414) was added to support this copy operation. Design configuration 414' corresponds to configuration object 414. Both configurations (200, 414) share all of their components, including the Top Brick in-place definition configuration (402). Reusable definition TwoBrick (116) includes reusable definition configurations (306, 308) for defining assemblies 2B-A and 2B-B. Reusable definition Brick (108) now has two reusable definition configurations (302, 304). This sharing of configuration components (usage configurations or in-place definition configurations) between parent definition configurations is the mechanism that avoids the need to make Top Two Brick (102) a reusable assembly because configurations can share in-place configuration components (e.g., 402).

FIG. 5 also adds 1B-H, a configuration of Brick with a hole (302), and 2B-B, a second configuration of TwoBrick (308), which shares the Right definition usage configuration (410) with 2B-A, and adds a new Left definition usage configuration (412) that is an instance of the hole brick, 1B-H. Note that the addition of 2B-B and 1B-H have no effect on the SixBrick copy configuration, 6B-A2.

Figure 6:
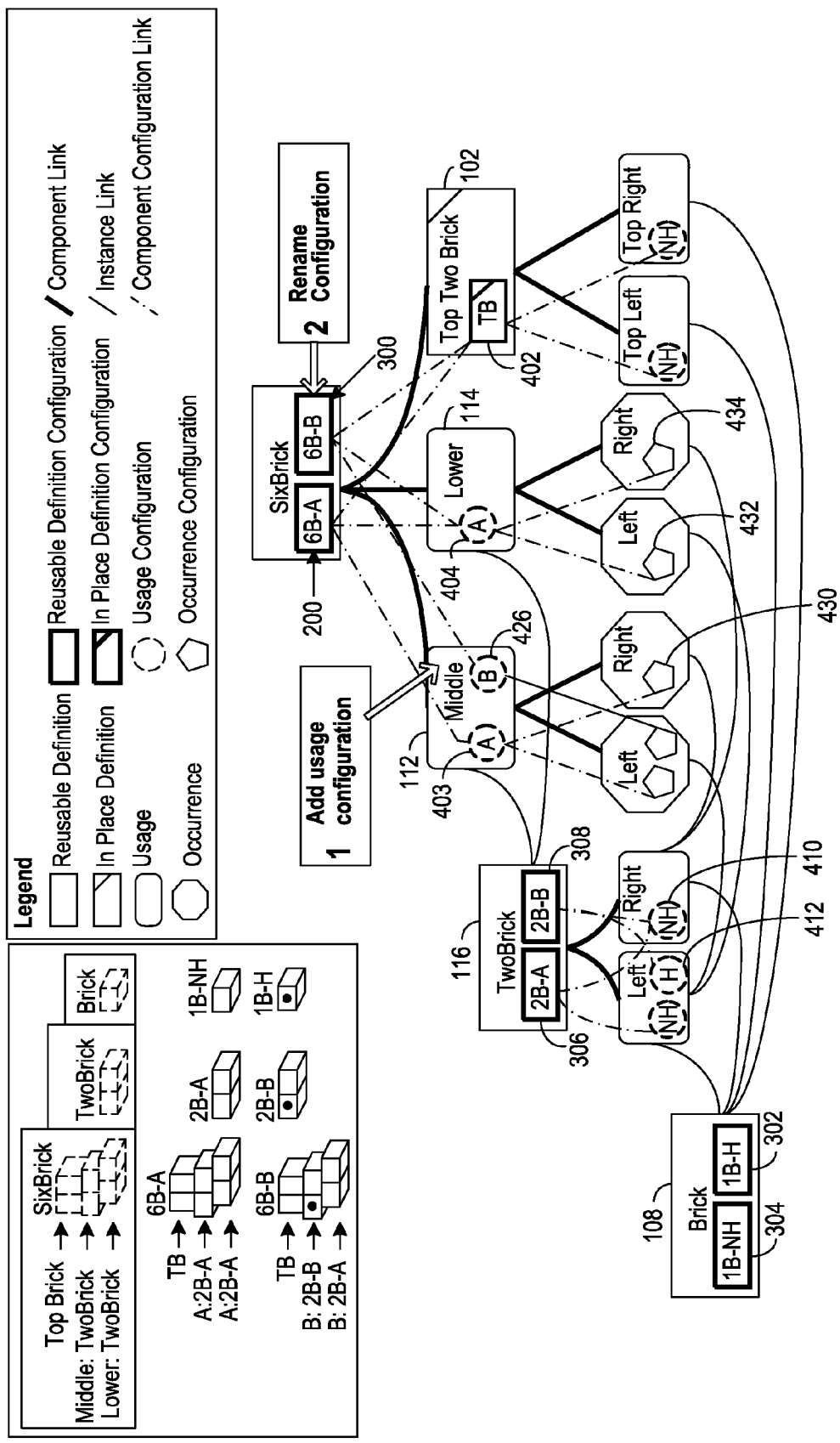
FIG. 6 illustrates a multivariant definition tree that incorporates both variations of the assembly from FIG. 3, in an EGPS.

In FIG. 6 the second Six Brick configuration is renamed from 6B-A2 (414) (see FIG. 5) to 6B-B (300). It represents the same design as does the 6B-B definition in FIG. 3. In order for it to represent the distinct Middle component of 6B-B, a new configuration (426) is added to the Middle usage (112). Usage configuration 426 is an instance of 2B-B (308), whose Left usage configuration component (428) is an instance of the spy-hole brick, 1B-H (302). 6B-B maintains its component links to the shared component configurations in Lower (404) and Top Two Brick (402), but links to the new usage configuration (426) that is an instance of the 2B-B definition configuration.

EGPS minimizes the number of objects used to capture designs for future use, re-use and modification. It creates an efficient and scalable representation of the two SixBrick assembly designs by recognizing the previously-introduced single variant definition tree as architecture. This provides a mechanism for creating variants of a design that share all common design data.

Thus EGPS eliminates redundant data objects used to represent product family variants. As a result, more information is captured in computer-sensible form while using less data than with the SVPS equivalent.

For the scalability of EGPS, occurrence configuration nodes (430, 432, 434) are shared by the design configurations 6B-A (200) and 6B-B (300). This means that even when there is a difference at one level in the tree (e.g., Middle—402, 406), there may still be shared content at low levels (e.g., 436) leading to the shared occurrence nodes (e.g., 430, 434).

EGPS facilitates representing the different levels of abstraction when a large team of designers concurrently design a complex product or product family. For complex designs, teams work with the product at multiple levels of abstraction. One type of abstraction, granular abstraction, deals with different levels of granularity. At the coarsest level, the "product level," the design is represented by the highest level of component assemblies. At this level, an aircraft would be viewed as composed of wings, engines, tails, etc. At the finest level, an entire product is viewed as being composed of indivisible part instances, meaning that, at this level of granularity, the same aircraft would be viewed as being composed of ribs, tubes, rivets.

Another type of abstraction, design abstraction, considers that the entire product can be described from different perspectives, within which one may still have granular abstraction. For example, in the case of SixBrick, it has been represented from the viewpoint of its physical structure, but it has not yet been shown from the perspective of how it should be built. For highly complex products, there are multiple perspectives from which design teams represent and view the product. These perspectives typically span a range, from functions and simulations, to physical shape, to manufacturing plans. To deal with these multiple perspectives, "design domains" are established that allow simultaneously representing a product from multiple, distinct perspectives. Design teams make choices about whether different domains are warranted and, when they are, what domains are useful for a given product. There is not one correct set of domains and, in fact, there are complex trade-offs involved in the decision of whether to introduce a new domain. Experience has shown, however, that forcing multiple design perspectives into a single domain can cause much higher effort than having more than one domain.

There are three domains that have proven useful in capturing complex product family designs. Listed from a higher to a lower level of abstraction, the domains are described below.

System—This represents logical system elements, logical interfaces and connectivity structure between those elements, without describing their mechanical embodiment. System assemblies are often not realized by one physical assembly because their purpose is to clearly describe the elements and connectivity of a given system, versus the geometric composition of a reusable geometric assembly.

Geometric—This represents the part geometry and physical specifications, including interfaces. It also captures the geometric assembly structure, which includes the definition of where to position all parts and all assemblies at each level in the product structure. Aside from complexity management, the primary purpose of assemblies in the Geometric Domain is to support reusable design definitions; the secondary purpose is to efficiently support mappings from the System Domain to the Manufacturing Domain. This domain's product structure includes the traditional parts list (bill of materials) as a projectable view.

Manufacturing—This represents the sequence of assembly steps in which the product is constructed. The assembly sequence can be as simple as putting together assemblies defined in the Geometric Domain or, for more complex, built-up products, the assembly sequence can be decomposed into groups of operations, performed by a mechanic, that install groups of part instances in a certain period of time. This lowest level of manufacturing assembly is sometimes called a job. They are collected into higher-level manufacturing assemblies that are further collected, based on the factory location where the parts are installed. Manufacturing assemblies can be reusable/instantiable definitions, so that a given assembly operation can be relocated from one place in the factory to another.

These three domains handle only a subset of the design data necessary for a complex product. The following description illustrates how capturing EGPS data in multiple domains provides a more complete, shared representation than current approaches allow. Data not represented by these three domains include Functional Design, Requirements, System Simulations, Product Support and Maintenance.

The product-level definition tree for each domain captures the design of the product from a domain-specific perspective. The product structure within each domain is defined in terms of subclass specializations of the three EGPS Base Master Classes (definition, usage and occurrence) and three EGPS Base Configuration Classes (definition configuration, usage configuration and occurrence configuration). For each distinct domain, the six specialized subclasses are called the "Primary Classes" of that domain. Primary Classes are used to form the product structure of the domain. The subclass names for any specialization of the EGPS Master Classes are derived from 1) the base names and 2) the name of the class that inherits from definition. The subclass of definition in the System Domain is "system." Hence "system usage" and "system occurrence" are the other two Master Classes. The configuration class names are derived by adding configuration to the end of the Master Class names. For the System Domain this results in "system configuration," "system usages configuration" and "system occurrence configuration." The definition name for the Manufacturing Domain is "sequence," referring to a sequence of assembly steps, and is "part" for the Geometric Domain.

Each design domain represents a certain level of abstraction that acts as a requirement for the next less abstract design domain, if one exists. This means that, except for data that is fully specified in a given domain, each element in one domain is implemented by elements in the next, less abstract domain. An "accountability mapping" captures mapping between such pairs of domains. In the three domains discussed, there are two mappings: (a) one from systems to parts; and (b) one from parts to manufacturing sequences.

Figure 7:
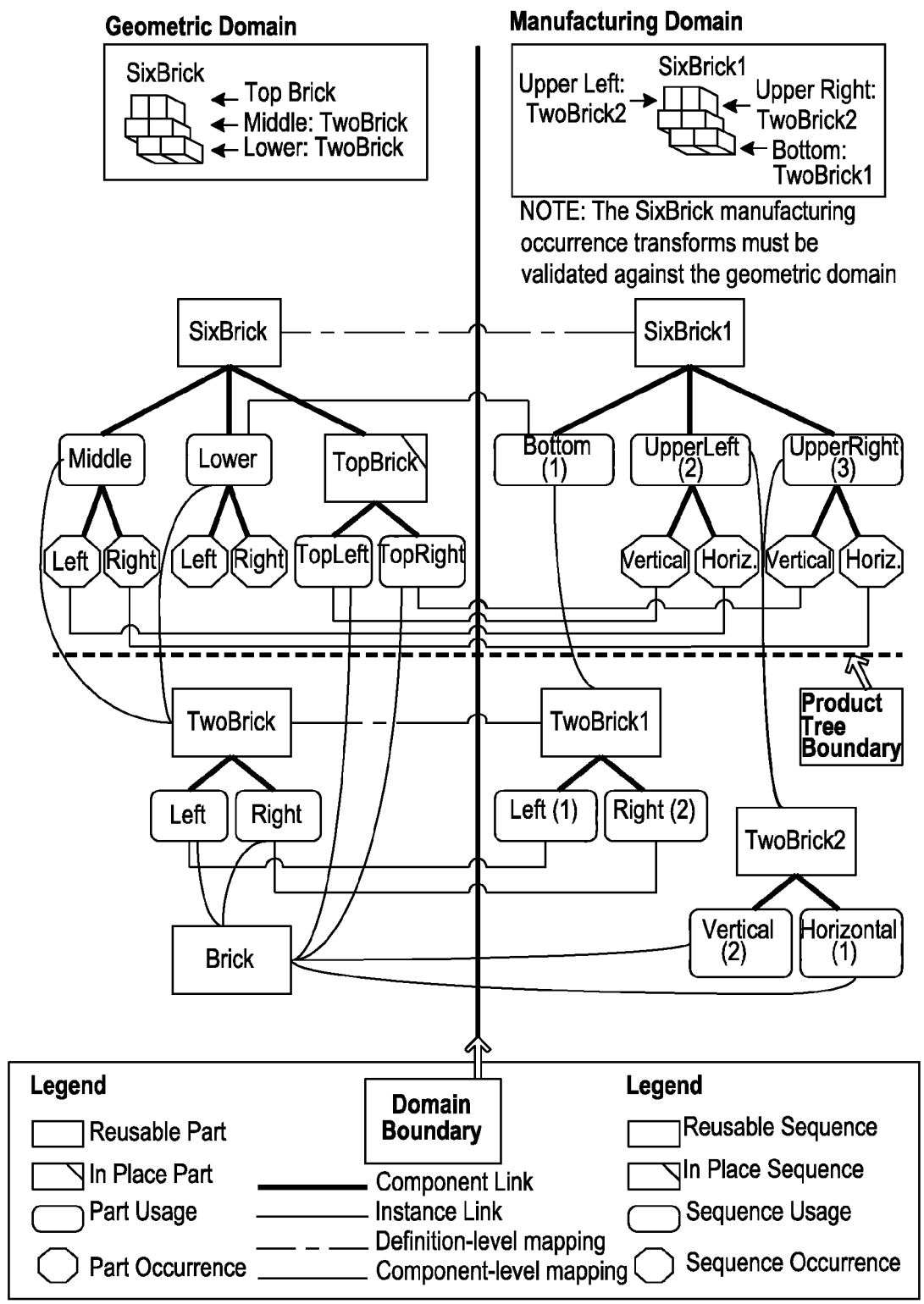
FIG. 7 illustrates a manufacturing definition tree for the SixBrick assembly illustrating the interrelationships between it and the Geometric Domain SixBrick assembly of FIG. 2, in an EGPS.
Figure 8:
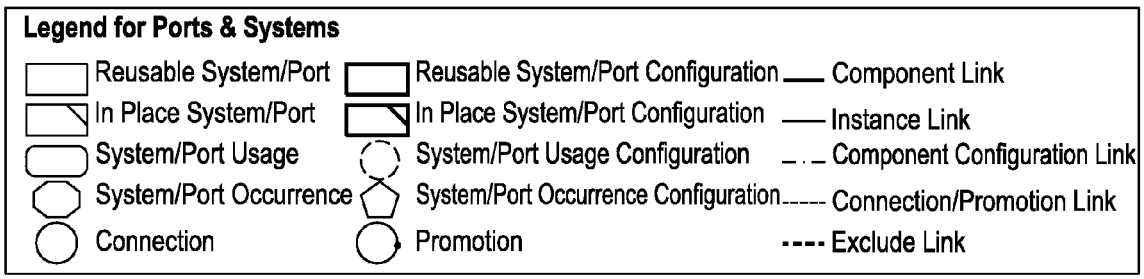
FIG. 8 is a legend applicable to FIGS. 9-17.

Referring now to FIG. 7, the SixBrick assembly example is used to provide an example of how to establish an interdomain accountability mapping. FIG. 7 shows the Geometric Domain on the left, and the corresponding Manufacturing Domain on the right. The SixBrick1 manufacturing sequence implements the SixBrick geometric assembly. Note that the Geometric Domain SixBrick model is identical to the model in FIG. 2 except for reformatting changes that places the definition trees in a vertical alignment. In this example, only the master classes of the two domains are shown, since the configuration objects inherit the mappings that are established between their master objects.

In the Manufacturing Domain, instead of assembling the brick from two TwoBrick assemblies, and adding the two Bricks onto the top, as might be inferred from the Geometric Domain product structure, a new assembly sequence called TwoBrick2 is defined. Two instances are used to build the top four brick occurrences on the SixBrick assembly. The lower two bricks are built up by assembly sequence TwoBrick1, which simply assembles the TwoBrick geometric assembly as an independent unit. Manufacturing components (usages) have a sequential number, added in parentheses, to indicate the assembly order. This sequence number is modeled by an attribute in the sequence usage subclass of usage, along with many other attributes specific to the assembly process. TwoBrick2 defines the geometric location of its components, which are both instances of geometric Brick part, in addition to being assembly sequence steps.

The positions of the two Vertical and two Horizontal occurrences, in SixBrick1, are validated against the corresponding occurrences positions in the SixBrick geometric assembly. This is because, even though the manufacturing design can introduce new or restructured assemblies, the occurrence locations are ultimately defined by the geometric design, not by the manufacturing design.

The horizontal lines in FIG. 7 are the interdomain mappings: (a) the thicker straight lines are "definition level" mappings, indicating that the manufacturing definition implements the geometric design; and (b) the thinner lines are "component level" mappings that implement the required accountability mapping between components in both domains.

The Lower usage in the Geometric Domain is mapped to the Bottom usage in the Manufacturing Domain, indicating that a complete TwoBrick assembly will be installed at that point by the sequence usage, Bottom. The UpperLeft and UpperRight assembly sequence usages each install an instance of the TwoBrick2 subassembly, which is built up as an independent assembly. Since the introduction of TwoBrick2 involves a restructuring of the geometric assembly, the component occurrences of Middle and Lower on the geometric design are individually mapped to the component occurrences of the UpperLeft and UpperRight usages in the SixBrick1 manufacturing sequence.

The example in FIG. 7 only shows complete accountability mapping between geometric and manufacturing root assemblies. However, it is possible that designs in the Geometric Domain may not have a corresponding design in the Manufacturing Domain, or that a manufacturing assembly may not be defined in the Geometric Domain. In this case, definition mappings can also indicate a partial accountability mapping.

When this occurs, missing parts must be added at a higher level of assembly sequence. To ensure a complete product, all instances must be accounted for by the product level mapping between the product's geometric assembly and it corresponding manufacturing sequence.

The components of a single system in the System Domain frequently are implemented by part instances that span many different geometric assemblies. Such part instances can be termed "integral systems." Heating and cooling systems along with electrical and hydraulic systems are examples of "integral" systems, as opposed to modular systems which are contained entirely by one geometric assembly. The existence of integral systems is one factor that drives different assembly structures between the System Domain and Geometric Domain.

It is also possible to have many physical embodiments of a given system design in the Geometric Domain since even trivial shape modifications of parts can result in two physically distinct designs that implement the same system.

It also is possible for two system components to be implemented by one geometric design. For example, an electrical grounding component may be implemented by the same hydraulic tube that also implements a logical transport net that connects two hydraulic system equipment components. This fact could be very confusing if it were represented in a single domain.

While "EGPS Primary Classes" are used to define some aspect of a design from a fundamental perspective, "EGPS Secondary Classes" capture a secondary aspect of the product, such as physical ports on parts, or logical ports on systems. Two important secondary classes are described below.

"EGPS Association Classes" capture all relationships that are not modeled explicitly as class relationships.

"EGPS Port Classes" establish and enable formal management of specific connection points on the primary product structure objects in a given domain.

A "class relationship" is formally modeled as a relationship between the definitions of the two classes. These are important to managing interfaces between primary components.

Association Objects relate two other objects to each other. Hierarchical assembly, instancing and exclusion relationships are not captured with association objects, because they are represented explicitly in the EGPS class model. Any relationship not captured explicitly is modeled by Association Objects, which come in two types: global and local.

"Global associations" may be in-place or root definitions, but may not be instantiated as children of other definitions. This is an exception to the rule in which root definitions are reusable, and is an example of what we call an additional business rule that can override the standard EGPS behaviors. Their purpose is to relate objects in a global space of objects. "Local associations" are in-place, and have a primary definition. This means that they are defined in the context of a particular definition tree, and may only relate other objects that are also in that tree.

Global associations can be used to capture interdomain mappings. Global association objects implement both definition-level and component-level mappings. All of the relationships between two corresponding definition trees in two distinct domains are captured by association objects that are in a common association tree: a root association object maps between the two corresponding root reusable definitions, while its in-place association components map between the components of the two definition trees.

Ports play an important role in capturing many types of connectivity in concert with local connection objects. Ports represent connection points on a primary definition. Specifically, ports identify distinct connection points and can contain distinct attributes for them.

For example, in an instance of a hydraulic pump, there are two connections to an instance of a hydraulic actuator: one connection for pressure, another for a return line. This is captured in the systems domain by connecting each of two ports on the pump instance to a corresponding port on the actuator instance.

For complex systems, with many ports, hierarchical EGPS behaviors are necessary to manage complexity. Even though port is an EGPS Secondary Class, it can be defined as a reusable definition, to allow a common port structure to be defined and instantiated as a component of multiple Primary definitions. This is achieved by creating a port usage to instantiate the reusable port definition on a Primary definition. A useful application of reusable port definitions is to create a port library.

Since there are many distinct types of connectivity that follow a common connectivity pattern, "EGPS Base Port Classes" are used to inherit from the EGPS Base Classes. Distinct port types are modeled as subclasses of the EGPS Base Port Classes. Port EGPS Classes play one of three roles: (a) an external connection point definition that is a component of a reusable definition; (b) a stand-alone reusable port definition; and (c) a connectible port on a definition tree component. Any port whose primary parent is a reusable design is an external connection point definition. These cannot be connected to any other ports.

When ports have primary parents that are components in a definition tree, they are connectible. Within a common definition tree, the association of two connectible ports represents a connection between the primary parents of those ports. Connectible ports can be connected to each other from different levels in the definition hierarchy, except when their primary parents have a direct or an indirect parent-child relationship. This means that a port on a child component may not connect to a port on its primary parent or any other up-tree parent.

Two significant local association classes are connection and promotion. "Connection" objects establish a connection between connectible ports that are in a common definition tree. In the system domain, these connections objects represent requirements that are implemented as a physical connection in the geometric domain.

"Promotion" objects link an internal connectible port to an external connection port, on the root definition. The internal port is published on the external connection port. Each instance of a system has a connectible instance of each external port that is defined on that system. Some systems, called "black boxes," require that any connection to one of their internal components is made via this promotion mechanism.

There are many constraints on the relationships that are specified by the EGPS Base Class model. In general, parent-child relationship rules are specified for each primary and secondary class subtype. Some of the rules are intuitive: A port can be a child of a system. A port can also be a child of another port. But a system cannot be a child of a port.

Systems and parts usually have the full EGPS behavior of both in-place and reusable definitions. In addition, business rules can be applied to, for example, limit a certain secondary definition subclass to only allow in-place definitions. These types of business rules may vary from company to company, reflecting different policies or useful product abstractions, given a certain product types or business processes. For example, one company may choose to model their simple products with no system domain at all and to instead model port connectivity in the geometric domain, whereas a company with more complex products may choose to model all connectivity in the system domain, while validating that the corresponding physical items are geometrically connected.

In addition to parent-child relationship rules, there are both connectivity and general association relationship rules. These rules depend upon the primary class type of their definition tree (if applicable), what their object types are and, in some cases, their particular attribute values. For example, whether or not two ports may be connected depends on their type and specific attribute values, such as their directionality.

In the System Domain, a connection object is used to connect two system ports. The System Domain itself captures the connectivity requirements for the geometric design, so the meaning of a connection object is as follows. A system component and its ports are implemented by an instance of a geometric part, which has geometric ports corresponding to the system component logical ports. The connection object acts as a requirement that the ports in the physical domain must be connected to each other.

Usually system designs require a net between the equipment entities, reflecting the fact that system equipment usually are connected by a geometric transport element, like a tube or wire, and not directly attached to each other. Such a system net component is implemented by the transport element in the Geometric Domain.

It is also the case that engineers often want to interact with a tool that allows them to simply connect equipment port to equipment port, ignoring nets. In prototype authoring tools, authoring modes are provided in which the nets are authored automatically, behind the scenes, to support such a view.

The following examples introduce hierarchical, multivariant ports, nets, connections and promotions in the context of a simple system design. In addition to illustrating port behaviors and rules, these examples also introduce the concept of a "projection" that is a single variant view of a particular definition configuration so that designers do not have to deal with the full complexity of the EGPS model as they view and edit their designs. This is beneficial for an effective implementation of EGPS, where end user authoring/viewing applications will present views closely related to these projections. When projected views are used, the application would interact with the user to ensure that no edit operation violates the EGPS product model/architecture.

The following examples present a simple system design: first of a generator system with ports, and second, of an engine system that includes instances of the generator, and finally by adding port and connectivity information to that second engine system model. Since some of the models require a significant visual vocabulary, we conserve space by presenting a single, consolidated legend in FIG. 8.

Figure 9:
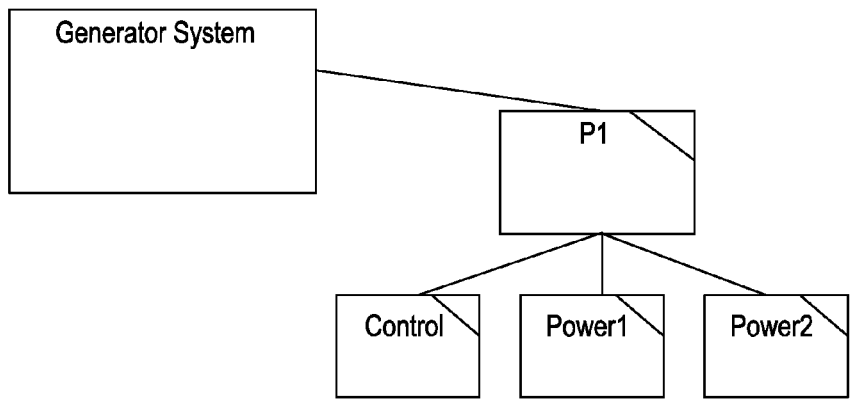
FIG. 9 illustrates a definition tree of a single variant design of a generator, which includes its in-place port children, in an EGPS.

Referring to FIG. 9, the Generator System has an in-place port, P1, which has three in-place port components: Control, Power1 and Power2. To visually distinguish P1 from an in-place system the parent-child link between it and the Generator System is drawn from the side of the generator. P1 represents a requirement for a physical connector in the geometric domain on the geometric design that implements the Generator System. Not all system ports represent a requirement for a physical connector. That status would be indicated by a specific attribute value in the port. The three in-place component ports are requirements for three pins within that connector.

Figure 10:
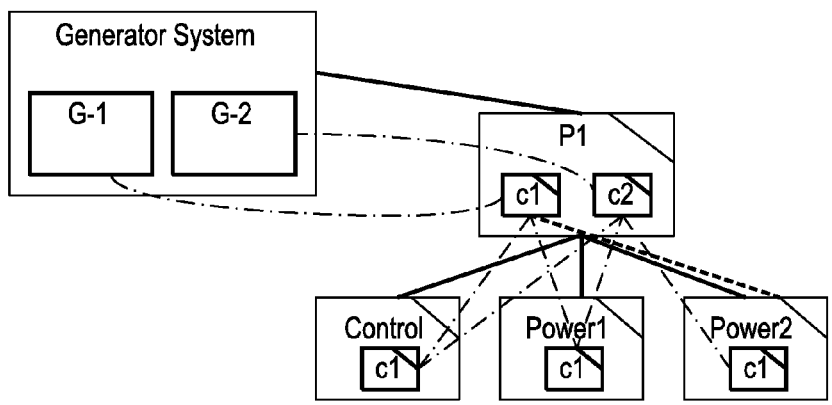
FIG. 10 illustrates a definition tree of the generator system of FIG. 9 and as a multivariant design with two configurations G-1 and G-2, in an EGPS.

FIG. 10 converts the single variant design of FIG. 9 to a multivariant design with two configurations: G-1 and G-2. P1 is also converted to multivariant with two configurations: c1 and c2. The port structure has explicit configurations for each in-place port.

Configuration names are scoped to their master object. Therefore, the four in-place definition configurations called "c1" are independent of each other. In referring to a configuration, when it is needed for clarity, the master object's name is prepended to the configuration object's name, followed by a colon. It is also true that all in-place definition and usage names are scoped to their parent assemblies. So, if there were two ports called P1, one on system S1 and the other on system S2, then they could be unambiguously addressed by S1:P1 and S2:P1.

The two port configurations, P1:c1 and P1:c2, share component port configurations Control:c1 and Power1:c1. Only P1:c2 includes Power2:c1 as a component. The idea is that G-1 is a standard unit with one power output port, and G-2 is a high power unit with two power output ports. The exclude link from P1:c1 to Power2 indicates positively that P1:c1 should not include a configuration of Power2. G-1 and G-2 have component configuration links to select their port configurations.

Figure 11:
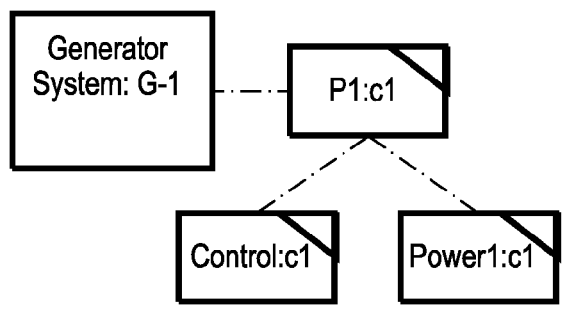
FIG. 11 illustrates a definition tree of a single variant view of the G-1 configuration projected from the Generator System of FIG. 9, in an EGPS.

FIG. 11 shows a single variant view projected from the G-1 configuration projected of the Generator System. It is created by simply beginning at G-1, and traversing the down-tree configuration links, showing each configuration object encountered.

Figure 12:
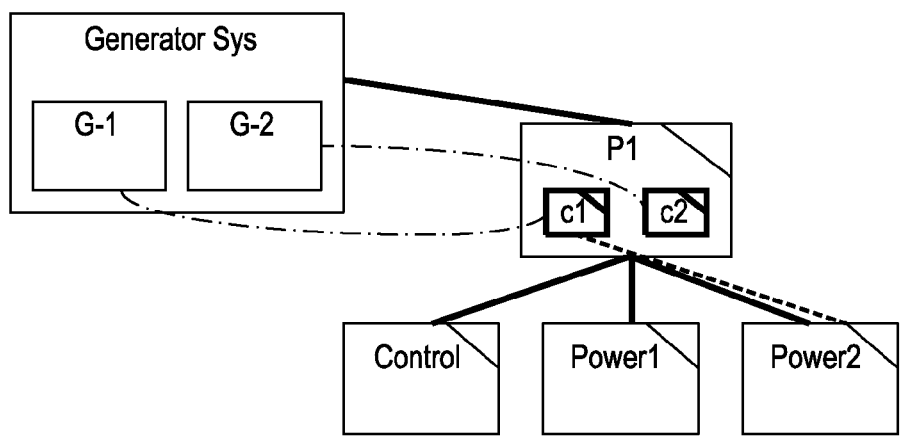
FIG. 12 illustrates a definition tree of the same multivariant design of FIG. 10, but that allows for single variant components in a multivariant architecture, in an EGPS.

FIG. 12 represents the same multivariant design shown in FIG. 10, but it allows for single variant components in a multivariant architecture. In FIG. 10, each of the three leaf-level ports has only one configuration: they are single variant definitions. They were given a configuration, in FIG. 10, only because their parent was converted to multivariant. Since the added single configurations add no information to their master definition, it is quite reasonable to let the master object play the role of both multivariant definition and definition configuration: that is the meaning of a single variant element in a multivariant structure. Each child component, with no configurations, is automatically included as a child of each parent definition configuration that does not have an exclude link to that child component. If a child component has configurations, then the parent configurations must select one and only one of those configurations unless there is an exclude link, such as the link from P1:c1 to Power2, in FIG. 12.

Figure 13:
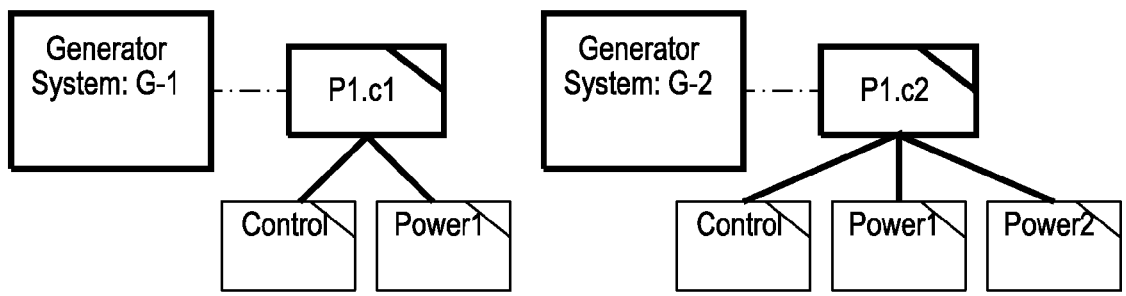
FIG. 13 illustrates projections of the two Generator System configuration of FIG. 12, in an EGPS.

FIG. 13 shows projections of the two Generator System configurations. This illustrates how the definitions, Control, Power1 and Power2 are projected as components of P1 configurations. Note that the two generator projections are shown as if they shared no common definition data; instead, sharing is captured in the underlying EGPS data.

Figure 14:
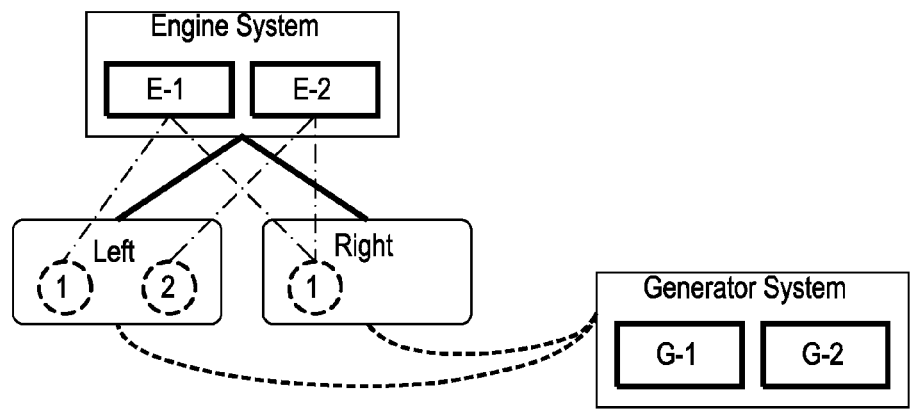
FIG. 14 illustrates a definition tree of a multivariant engine system showing that the engine system is composed of two usages that are instances of the Generator System, in an EGPS.

FIG. 14 is an example of a simple engine system that will be extended to illustrate the concepts of ports, nets, connections and promotions. FIG. 14 shows that the Engine System is composed of two usages, Left and Right, that are instances of the Generator System, from the previous example.

The Engine System has two configurations: E-1 is composed of two instances of G-1. E-2 is composed of one G-1 instance and one G-2 instance. G-1 is a normal capacity generator variant, which needs one output port for power and one for control, whereas G-2 is a high capacity variant needing two output ports for power and one for control. This means that the Engine System needs either two or three power output ports, to support both configurations.

Figure 15:
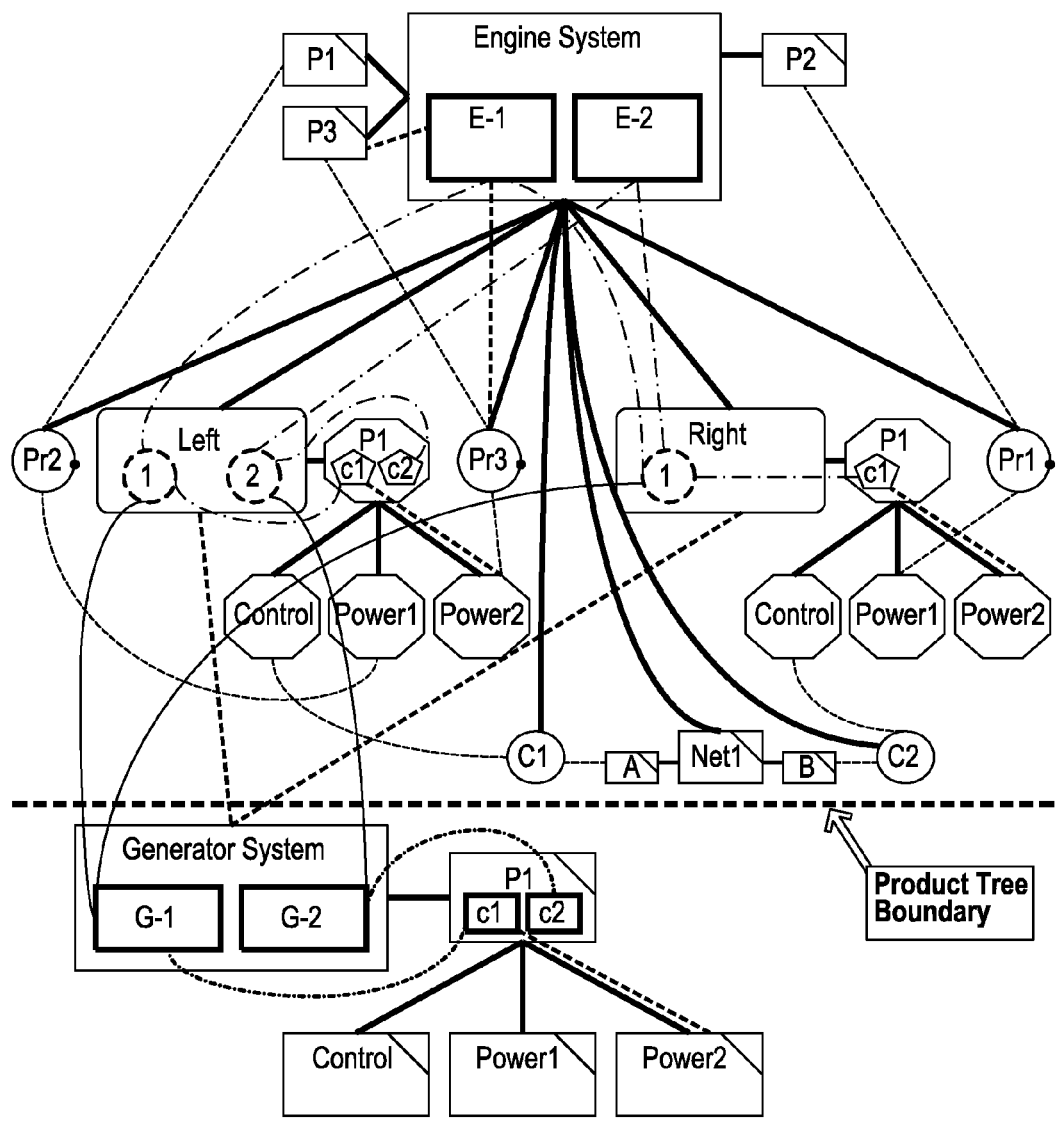
FIG. 15 illustrates a definition tree to accommodate the two engine configurations introduced in FIG. 14 into a complete system, which includes ports, connections, promotions, and a net in the engine system and uses the full multivariant generator system of FIG. 12, in an EGPS.

FIG. 15 shows the complete design to accommodate those requirements, in addition to connecting the controller ports on the two generator instances.

Ports—P1, P2 and P3 are added to the Engine System. P3 is included in configuration E-2, but not E-1, as specified by the exclude link from E-1 to P3. Those ports are the engine's official external interfaces. Were the engines instantiated on a higher level product, each usage of the engine would have three port occurrence components that are connectible instances of those ports.

The generator design is as described in the discussion of FIG. 12. Both usages of the Generator system in FIG. 15 (Right and Left), have a component port occurrence tree that is an instance of the Generator system's port tree. The configuration objects are also represented by occurrence configurations.

Five SV association objects are added to the Engine System: Promotion objects Pr1, Pr2, Pr3 and Connection objects, C1 and C2. Pr1 and Pr2 are promotion objects, which inherit from the local association class. Each promotion object links an internal, connectible port, on a component of the engine system, to one of its external interface ports: Left:Power1 is promoted to Engine:P1 via Pr2, Right:Power1 is promoted to P2 via Pr1, and Left:Power2 is promoted to Engine:P3 via Pr3.

Net1 is another SV child of the Engine System. It represents a requirement for a transport element connecting the two control ports in the geometric domain. Net1 has two child ports for making those connections. C1 and C2 connect the net ports to the control ports on each of the two generator instances. Since all of these nodes are single variant, they are shared between all configurations of the Engine System.

Figure 16:
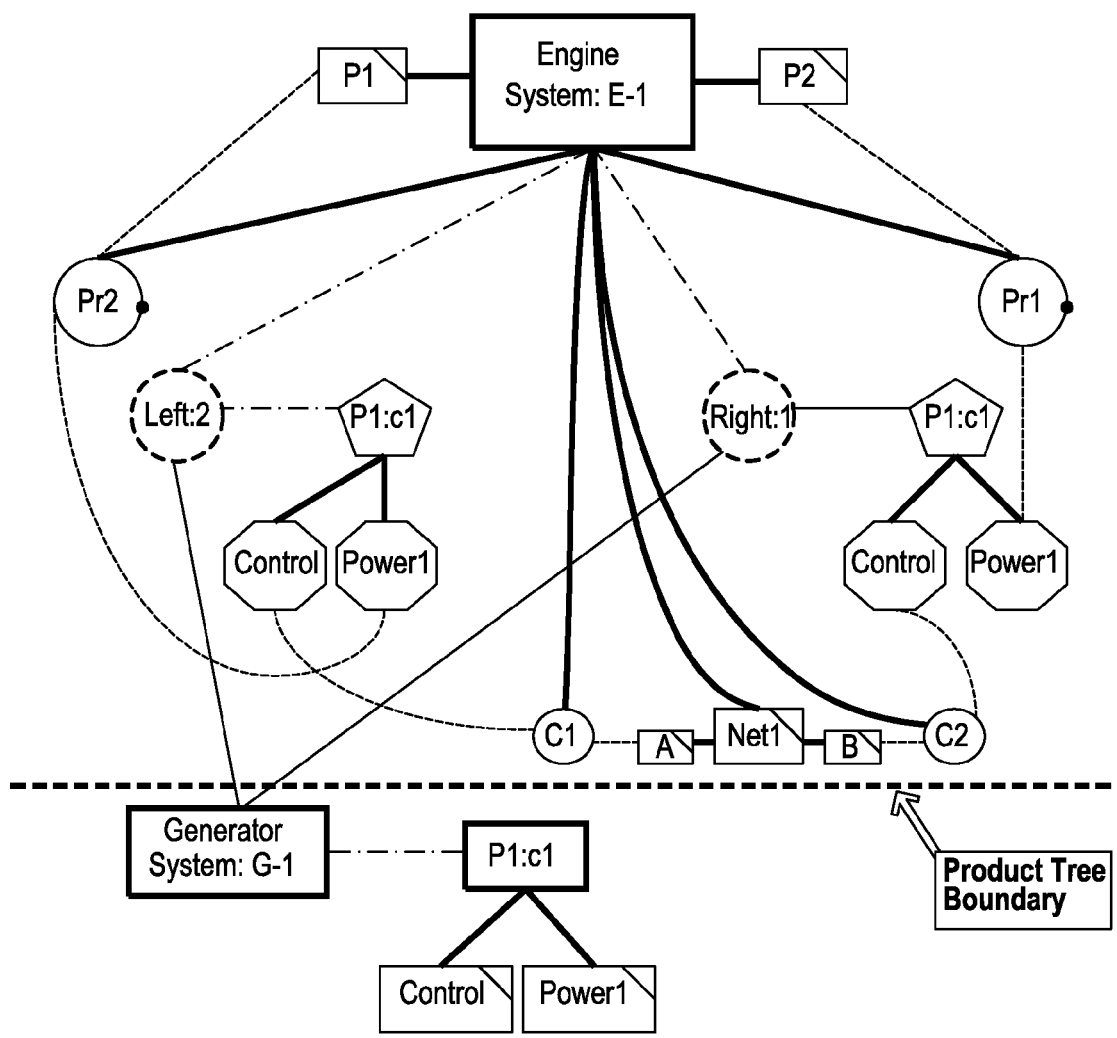
FIG. 16 illustrates a single variant projection of the Engine-1 configuration, in an EGPS.
Figure 17:
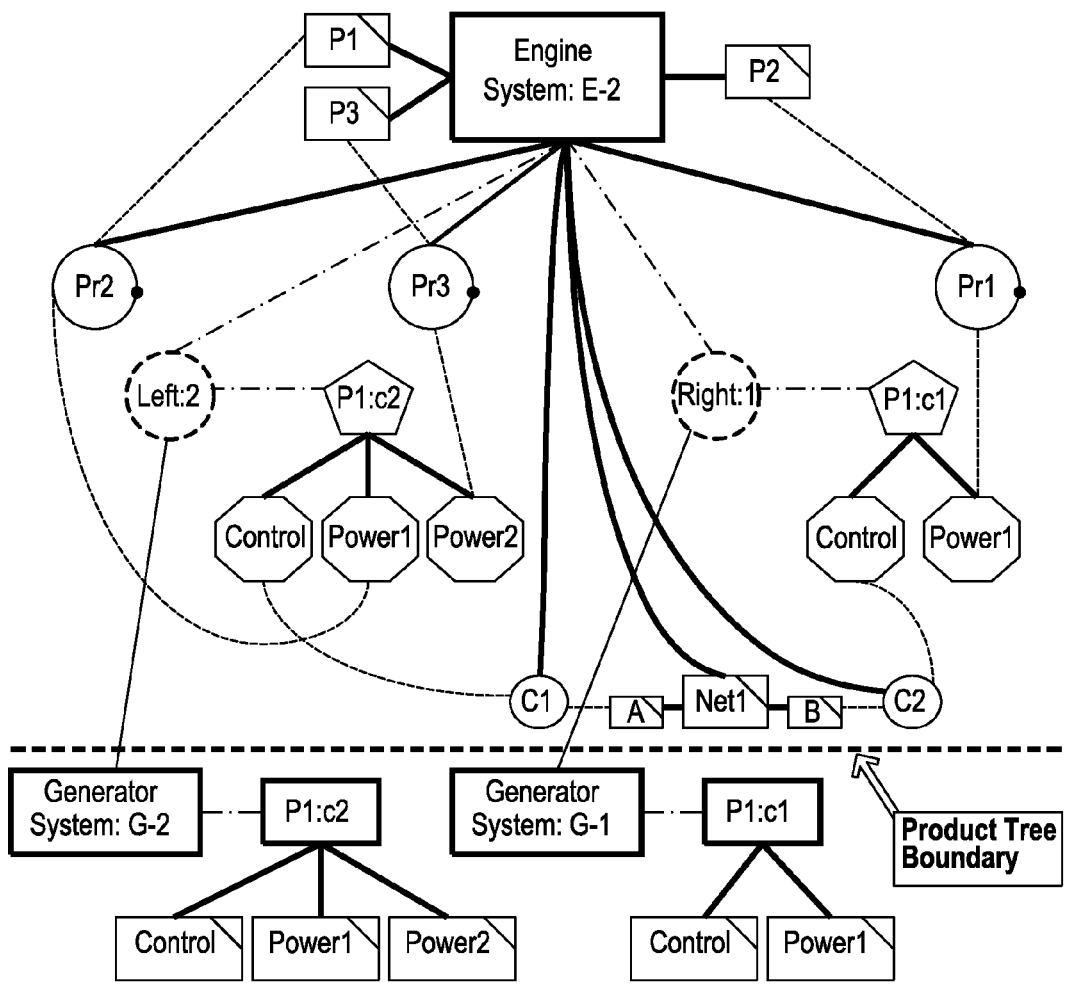
FIG. 17 illustrates a single variant projection of the Engine-2 configuration, in an EGPS.

FIGS. 16 and 17 show single variant projections of the two Engine System configurations. It is interesting to note how all single variant components of the engine system (which are not excluded) are completely shared between all variants. FIG. 16 shows the SVPS projection of Engine configuration E-1.

Ports can also be used to capture the exchange of data variables between software subsystems. For example, different configurations of a system may have common software modules that can be relocated from one computer to another in order to balance computing requirements. To do this, a software variable port class is defined to represent the variable in a subsystem that is either a published variable, which can be sent to others, or to a subscribed variable, which will be read from another publishing port. A connection between these types of ports on two software module instances represents a requirement that the systems exchange that variable regardless of what computers the software modules are located on. This software variable connectivity imposes requirements that must be met by the designers who place variables in packets, and who send the packets from system ports that are connected to data busses. If a software module instance is moved from one computer to another, an automated check can verify that all variables it sends and receives are correctly routed through the system. If not, an error is flagged, allowing the designer to fix and recheck the design.

Figure 18:
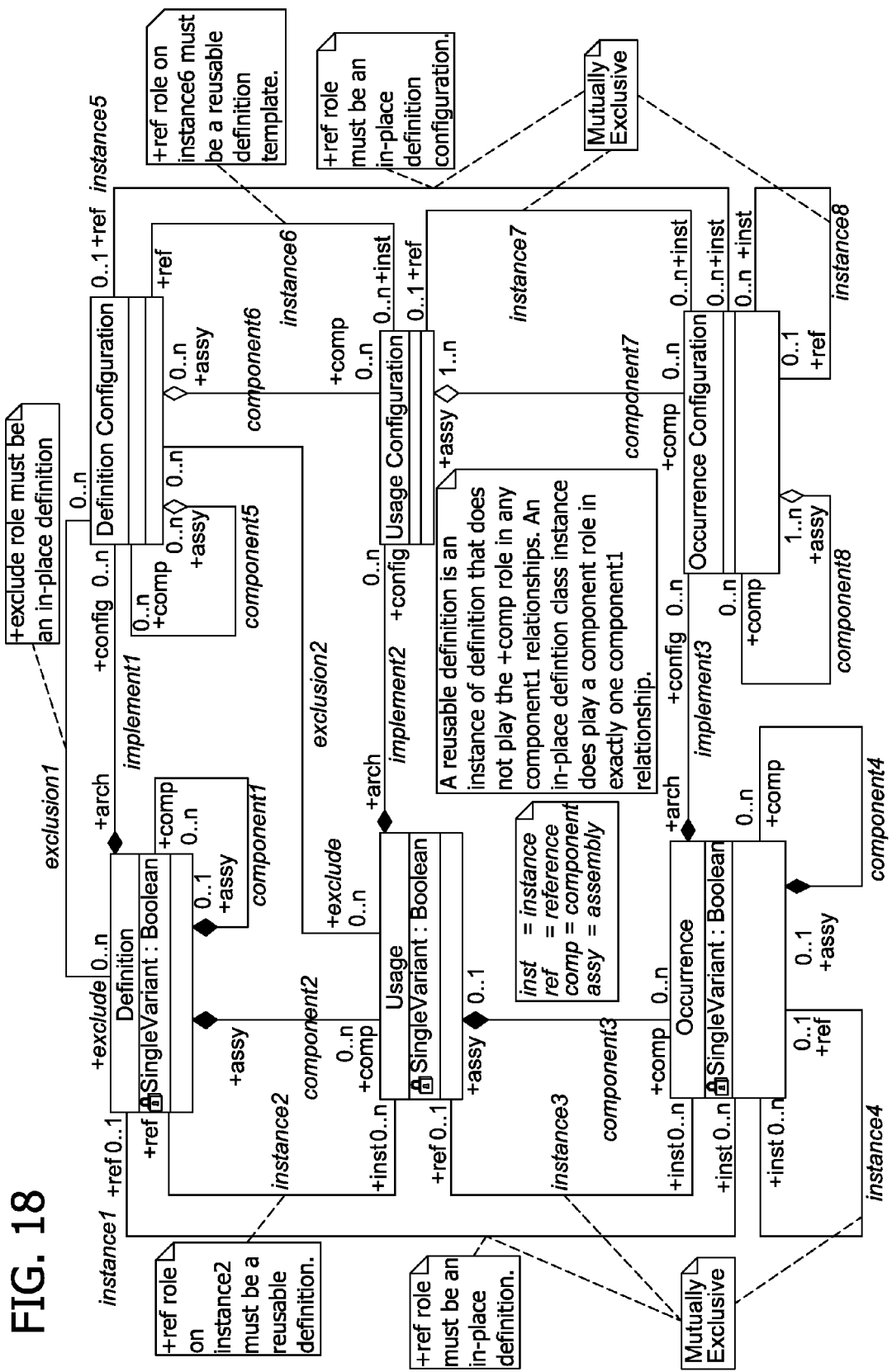
FIG. 18 illustrates a Unified Modeling Language class diagram documenting the class definitions and relationship structure for the Extended Generic Product Structure data model, in an EGPS.

Set forth below is a description of the SVPS and EGPS data models in terms of the industry standard Universal Modeling Language (UML) that has been widely covered by training and educational publications, including Unified Modeling Language User Guide (Object Technology) (Booth, Jacobson and Rumbaugh; 1998; ISBN: 0201571684). In FIG. 18, boxes represent class definitions, with names shown at the top. Class attributes are listed in the middle region of the box.

Although class models generally have a large number of individual attributes of different types, the data model shown in FIG. 18 is more focused on the structure of the model than in attribute particulars. That structure is captured by the relationships between classes, which are shown as lines connecting two classes, or connecting a class to itself.

Each relationship has three to five labels on it. The numbers, or number ranges—such as 2 or 0.1 or 0 . . . n—at the ends of each relationship line are called the "multiplicity" of that end of the relationship. Consider that a relationship, R, has two ends: Class A and Class B. The multiplicity of end A defines the number of R relationships that may be established from a Class B object to Class A objects. A fixed number means that number of relationships is required. The following example multiplicities imply that the listed numbers of relationships are required:

(i) No multiplicity means 1.
(ii) 0.2 means 0, 1 or 2.
(iii) 0 . . . n means 0, 1, up to an arbitrarily large integer number.

The end labels, preceded by a + symbol, are called the "role" of that end of the relationship, and are associated with the class on that end. They indicate the role played by their object, from the perspective of the object on the other end. For example, a role "+assembly" indicates that its class instances aggregate objects at other end of the relationship. The role on the other end of the relationship could be called "+component," if the aggregation has the meaning of a parent-child assembly relationship.

In FIG. 18, the italicized name between the two roles is the relationship's unique name. There is another more special type of relationship, with two variations. When a relationship has a diamond on one end, it indicates that the object on that end aggregates objects on the other end of the relationship. If the diamond is filled, then the aggregation is by value, which means that the aggregated objects cannot exist without the aggregate object. If the diamond is empty, the aggregation is by reference, which means that the aggregated objects can exist without the aggregation object. Generally, a class should only be aggregated by value by, at most, one other class. The boxes with a folded corner tag are comment notes. They have an optional link to the classes or the relationships to which the comment is addressed.

The terms "object" or "class instance" are reserved for the UML/programming meaning of instance. Otherwise, "instance" is used to describe instantiation of reusable definitions in the context of an assembly hierarchy.

The Extended Generic Product Structure data model of FIG. 18 contains, as a subset, the Single Variant Product Structure (SVPS) data model, which is comprised of classes "Definition," "Usage" and Occurrence," and relationships "Instance1-4" and "Component1-4" (this is a shorthand for the four relationships whose names begin with Component and end with a digit in the range 1-4.) Definition, Usage and Occurrence are Abstract Classes, because any system implementing an authoring tool based on them must define derived classes representing a specific type of definition.

"Definition" is the fundamental class, representing whatever subclass of which represents the entity that is being defined. The other two classes represent instances of other definitions, or definition components.

Definition objects may be used to define a tree using the Component1 relationship. The top definition object in such a tree has no parent definition, and is a reusable/instantiable definition: we call it a "root definition." All other definitions in the tree have a parent definition and are not reusable: they are called "in-place definitions," because they are "use-once" definitions defined in the context of their parent assembly, and ultimately in the context of a root, reusable definition.

As mentioned above, definition is considered the fundamental class, but really the root (instantiable) definition objects provide the central organizational principle of this representation. Each root definition defines a complete and independent definition context. Although instances (usages) of a reusable definition may be created as child components of higher level assembly definitions, the reusable definition itself has no dependency on any assembly that contains an instance of it.

The usage class is an authored instance of a definition, and is a component of one, and only one assembly, as shown by the Component2 relationship. That relationship also specifies that an assembly definition may have 0 . . . n component usages. Instance2 is the link from a usage object to the reusable definition object of which it is an instance. A definition may be instantiated by 0 . . . n usage objects.

Occurrence objects are always components of either a usage object, via relationship Component3, or of another occurrence object, via relationship Component4. These two relationships are mutually exclusive. Each occurrence object represents an instance of one component in a reusable definition tree. It therefore has one of the three mutually exclusive instance relationships, depending upon what it instantiates: Instance1 for an in-place definition, Instance3 for a usage, or Instance4 for an occurrence.

When using the SVPS model subset, all objects have the SingleVariant attribute set to TRUE. As mentioned above, the EGPS model of FIG. 18 can represent SVPS as a subset.

To model a variation, or configurations, of a product family, we move on from describing the SVPS model to describing the full, EGPS model. The SingleVariant attributes are set to FALSE in all definition, usage and occurrence objects that have multiple variants. The three Configuration Classes ("Definition Configuration," "Usage Configuration," and "Occurrence Configuration") are used to model distinct configurations of a part of the product family model that has multiple variants. The term "multivariant design" is used when multiple variants of a product family are being modeled. In that case, the terms "Definition," "Usage" and "Occurrence" Master Classes are used, in contrast to the other three Configuration Classes. When developing an EGPS multivariant product structure, the Master Classes have exactly the same structural behavior as in single variant mode, but they have a different interpretation. Instead of representing the design of an individual configuration, they provide a product structural form, or architecture, to which individual product configurations must adhere. This is why it is called a product structure architecture: it is a logical structure that constrains and defines the structure of its individual configurations.

Unlike the master objects, the configuration objects may be components of multiple assemblies, as seen by the 0 . . . n or 1 . . . n multiplicity on the +assy ends of relationships, Component5-8. This ability to share components is why the open diamond (aggregation by reference) is used on the +assy ends of those four relationships. This means, for example, a child usage configuration object would not have to be deleted if one or more of its parent design configuration objects were deleted, whereas that same usage configuration object must be deleted if its master usage is deleted.

Relationship Component6 can have a 0 multiplicity on the +assy end. This allows a usage configuration to exist without a parent assembly. This means that designers can author configurations of a usage and later specify a design configuration of which it is a component, since the usage, and not the parent definition configuration, owns the usage configuration. This is particularly useful when this model is extended to include the ability to generate configurations based on option selection and/or effectivity.

Relationships Implement1-3 represents the ownership relationships between the Master Classes and the configuration objects that implement them. Finally, the exclusion relationships, Exclusion1-2, indicate that the definition configuration should not have a component configuration that implements the component on the +exclude end of the relationship. The term "component" is used here to refer to either an in-place definition or a usage child object. Without any exclusion links, each definition configuration must have one, and only one component configuration from each component of its master definition. Without this type of link it would not be possible to distinguish an error of omission from a purposeful omission of a component configuration.

When some components of a multivariant architecture are single variant (do not have any configuration objects) then the Master Class objects also play the role of the Configuration Classes, as illustrated in FIGS. 12, 13, and 15-17. The exclude links enables this. Definition configurations automatically include single variant usages and in-place designs as implicit children (for use in projected views) unless the configuration has an exclude link to that object. In this case, a multivariant (SingleVariant attribute=FALSE) definition may have a single variant (SingleVariant attribute=TRUE) component. If the component is a usage, it must be an instance of a single variant definition. This mixing of SV and MV is an optimization representing the fact that a designer working in an authoring tool should not be forced to think of a single variant design as a multivariant design. An implementation of these concepts may make everything multivariant, behind the scenes, but provide such a view to the designer. In either case, the exclude link is critical for distinguishing between an incomplete design configuration and one that legitimately excludes an architectural component.

Figure 19A:
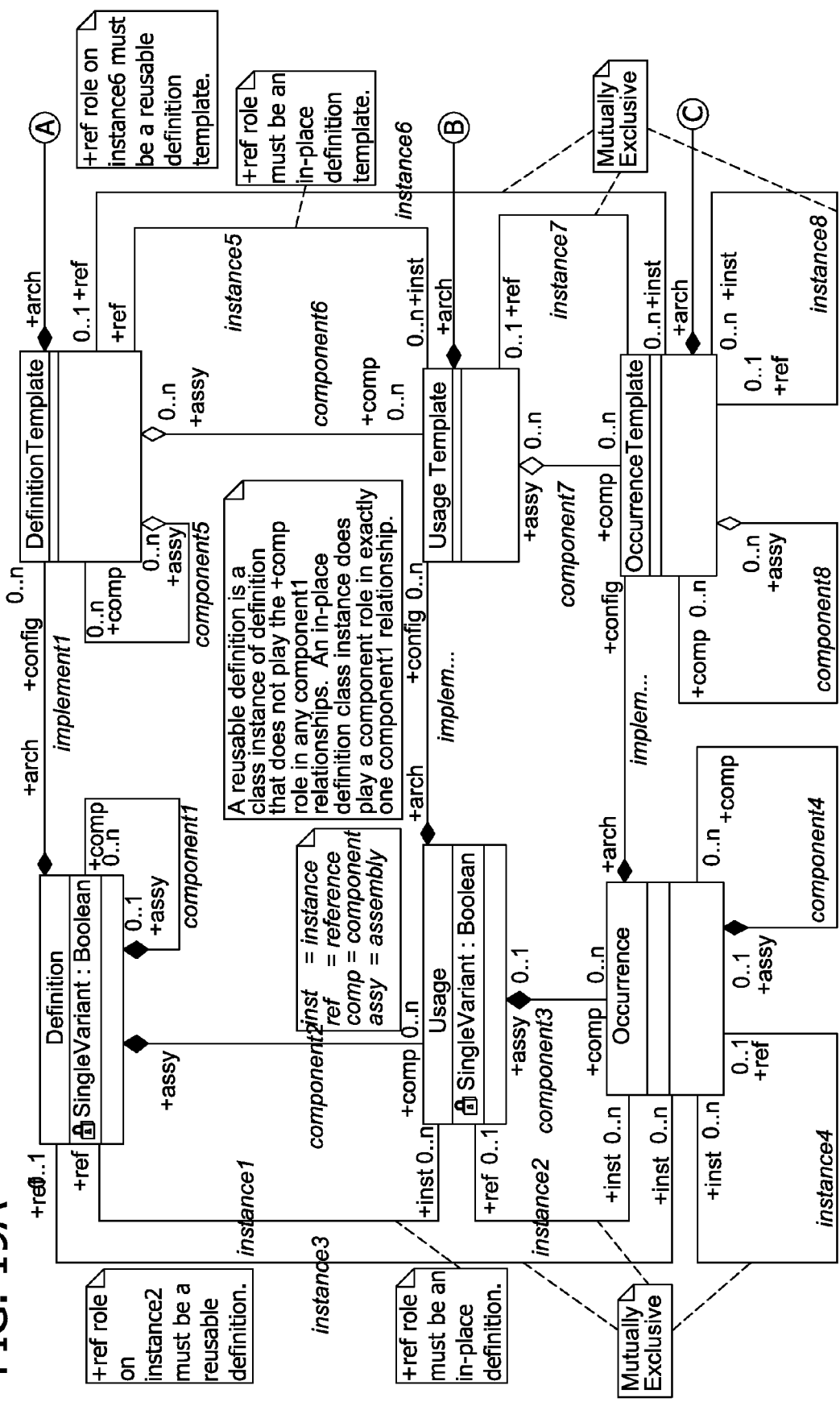
FIG. 19 is a Generalized Extended Generic Product Structure (GEGPS) data model, including Template definitions.
Figure 19B:
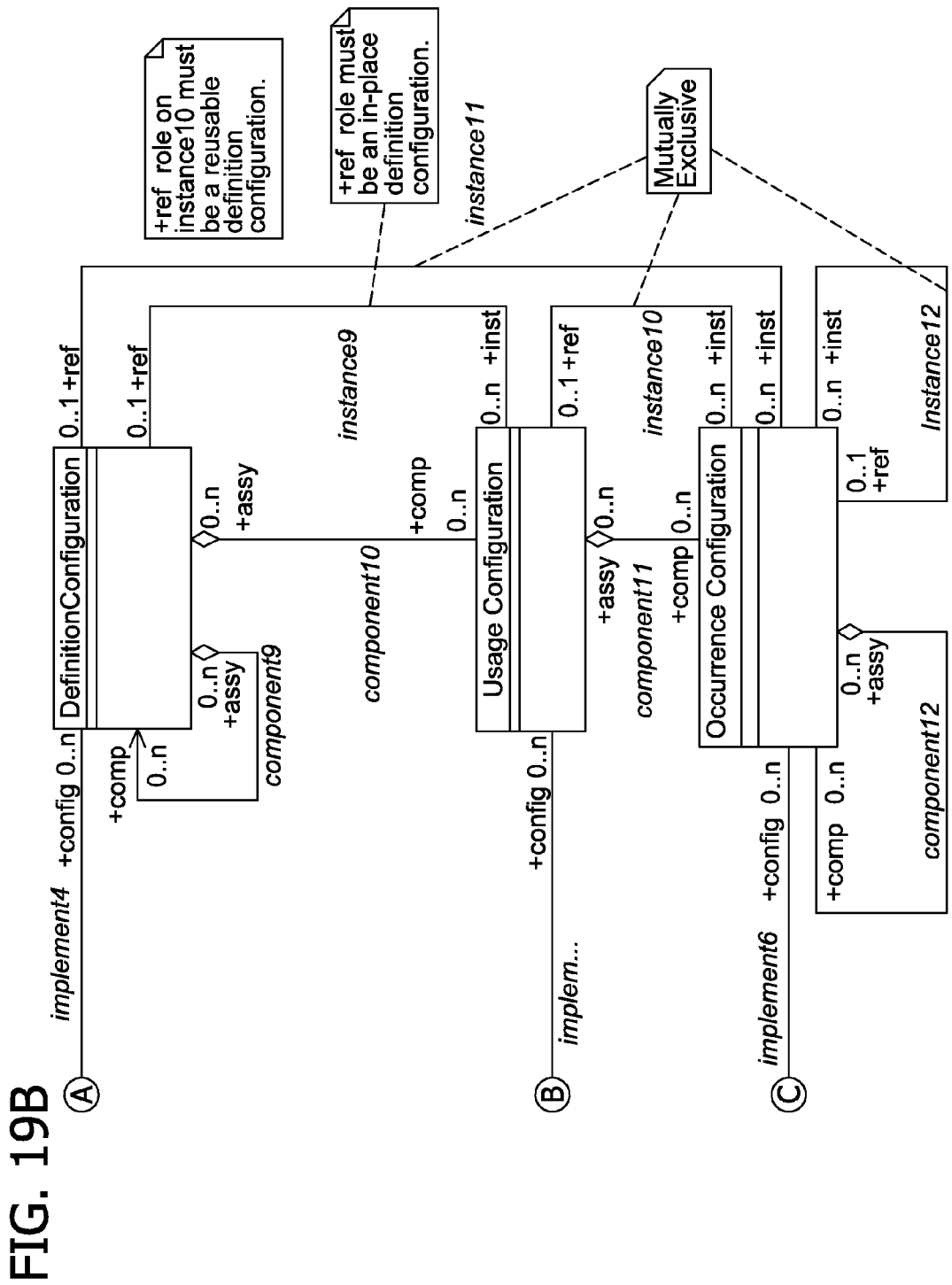
Figure 20:
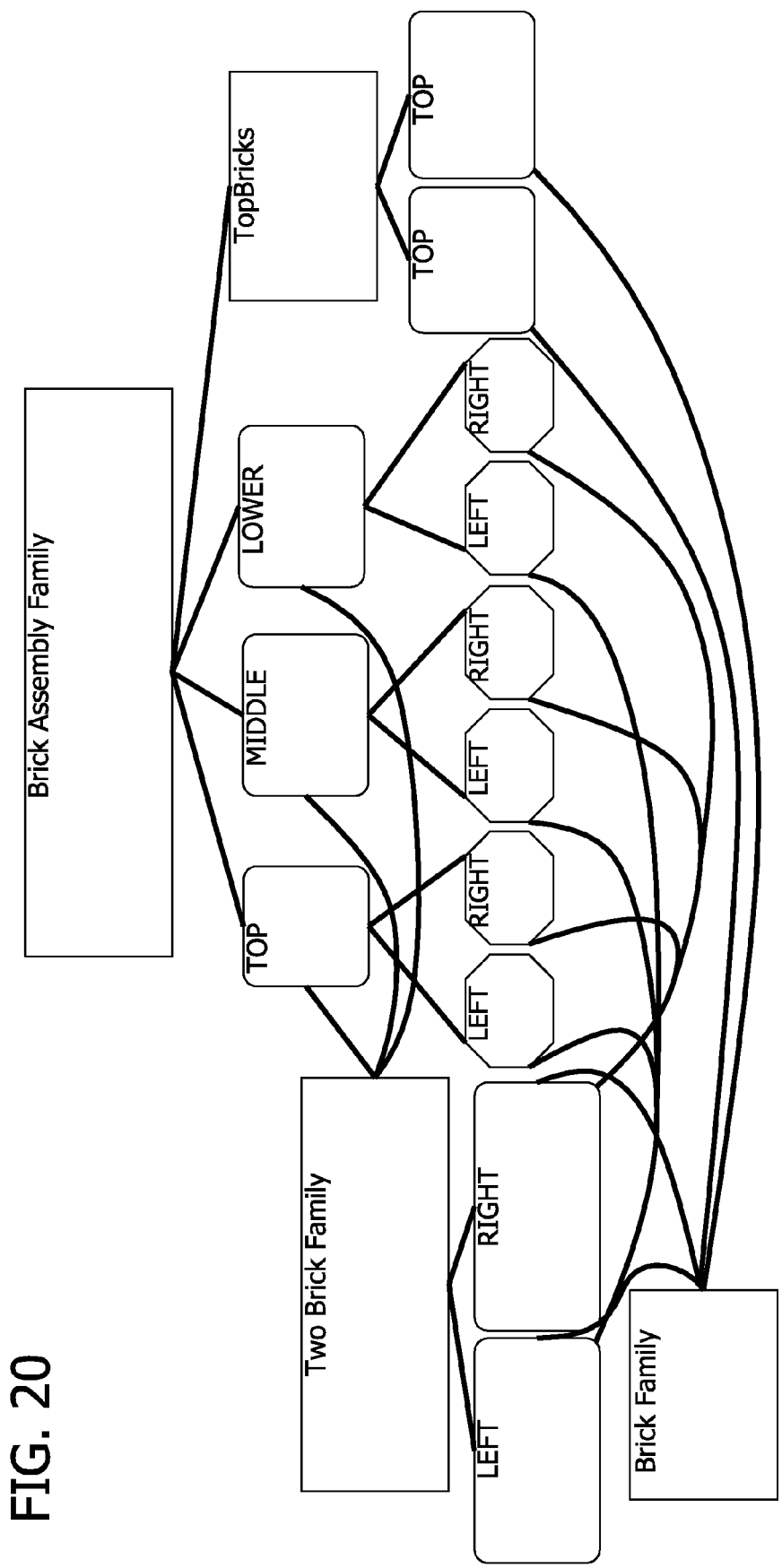
FIG. 20-25 illustrate an example of a design created using the GEGPS data model, including template trees.

Referring now to FIG. 19, the Generalized Extended Generic Product Structure (GEGPS) data model is shown. Such model includes, in comparison to the model illustrated in FIG. 18, classes that are used to define a different and additional type of tree structure—Definition Template, Usage Template, and Occurrence Template. Generally, the Template tree structure constrains permitted configuration tree structures, and specifies definition tree objects that are implemented by each template tree structure. For example, a particular product design structure variant may include a plurality of template trees, and each template tree represents a particular permitted structure which is implemented by its associated configuration trees. That is, each configuration tree is associated with, and structurally constrained by, one of the template trees.

The template trees facilitate ensuring that specific logical components, and no greater or fewer than that number of specific logical components, are implemented in a specific configuration. As used herein, the term "logical component" or component refers to a component or a link between components. Therefore, if a particular component or link is missing for a particular configuration, due to an omission or commission, such an error can be readily identified.

Template trees, in effect, constrain the architectural structure of a product version or variant. A configuration can either be a version or a variant of a product. Extra labeling can be used to track that information. The combination of the template trees and configuration tress represent the similarities and differences in the design content between configurations, and this fundamental capability facilitates managing versions and variants. Specifically, the product definition tree structure contains all permitted elements of a generalized product structure, and a template tree defines the permitted sub-sets of those elements implemented in its associated configuration trees. A plurality of configuration trees can be captured, with each configuration tree associated with one template tree.

Figure 21:
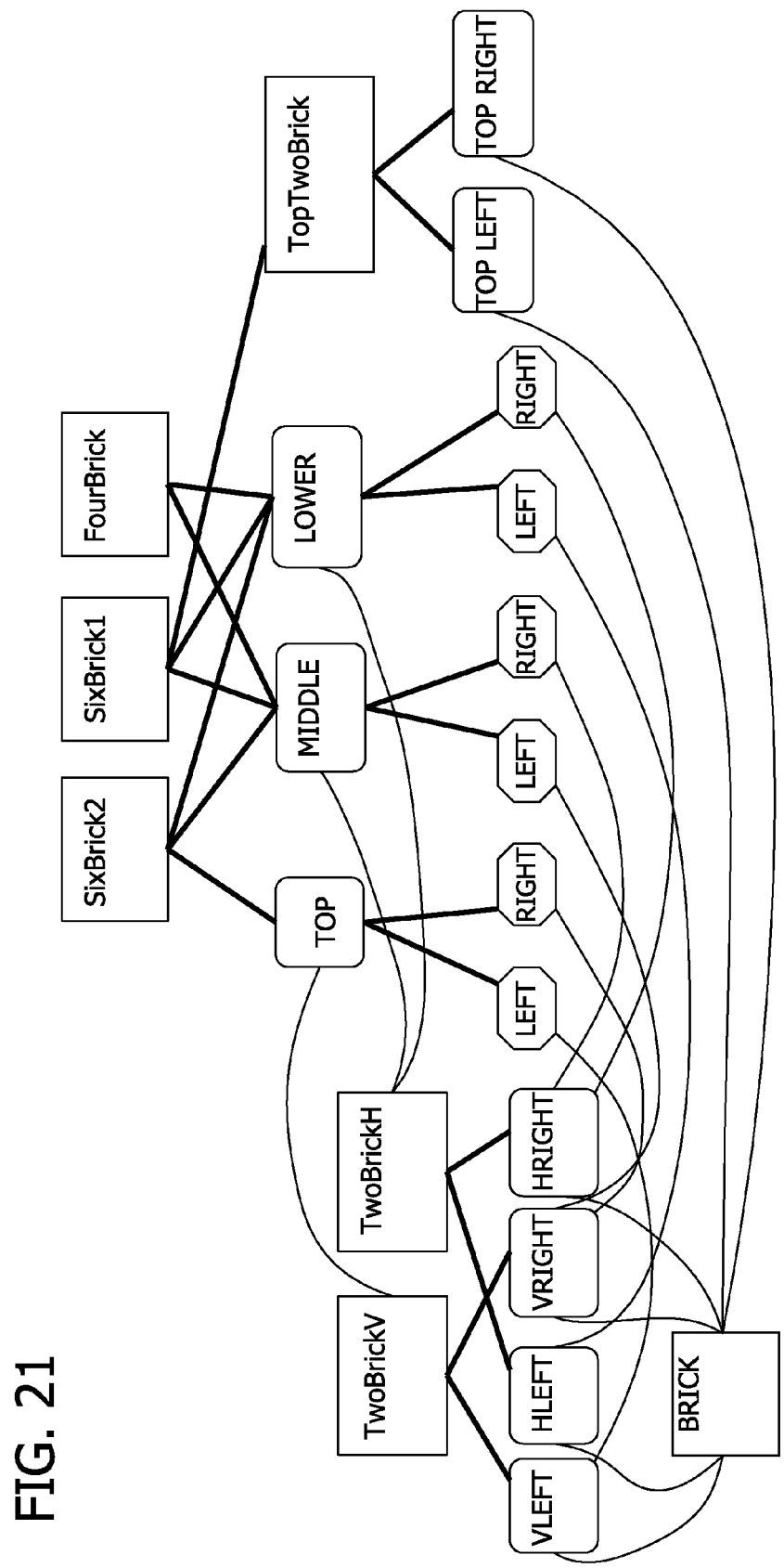

Referring now to FIGS. 20-25, FIG. 20 illustrates a product definition tree for a brick assembly family. The product definition tree structure contains all permitted elements of a six brick assembly. FIG. 21 illustrates, in addition to the product definition tree, three template tree structures which constrains the architectural structure of the product variants and versions to these three logical structures.

Figure 22:
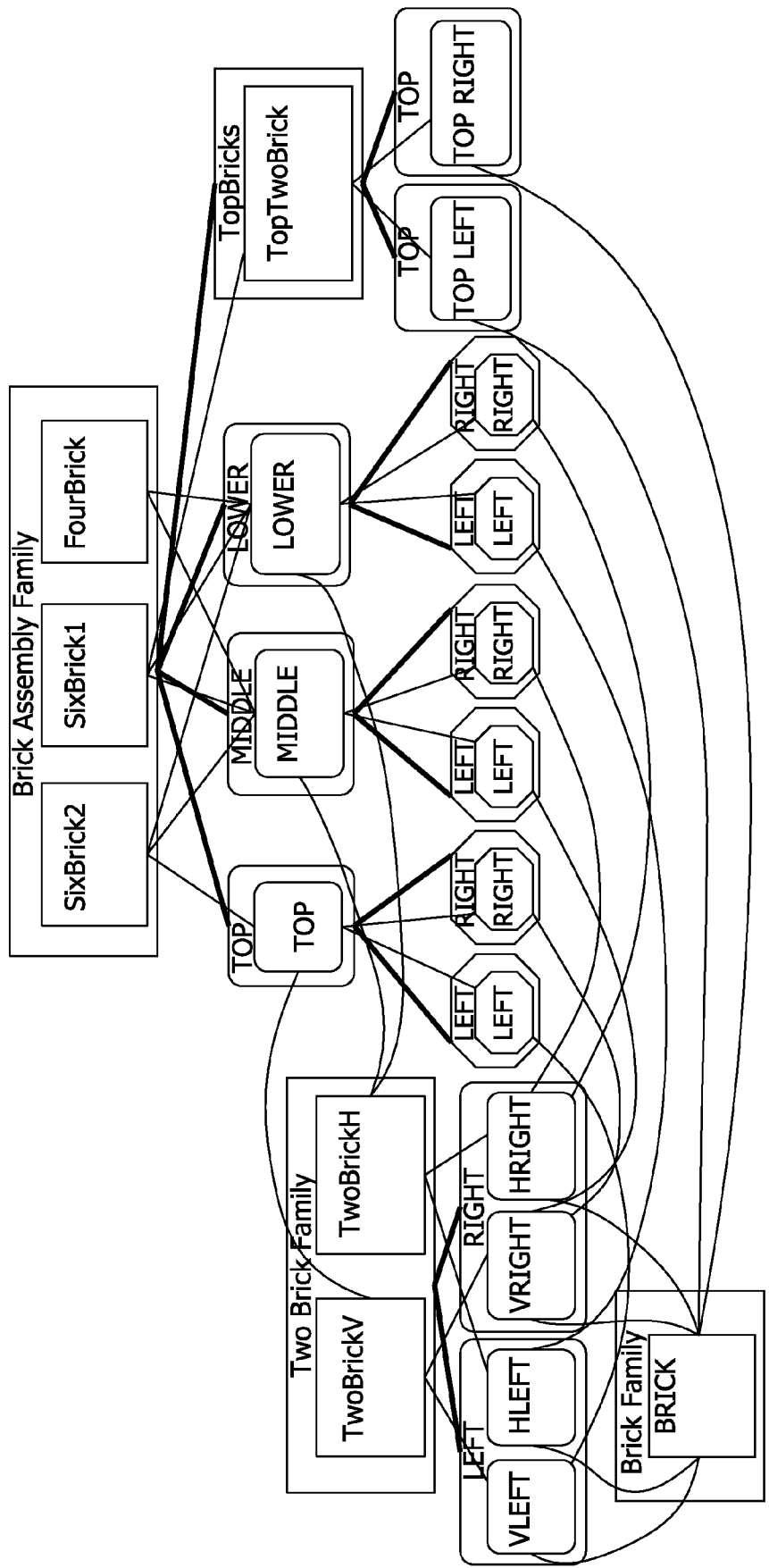
Figure 23:
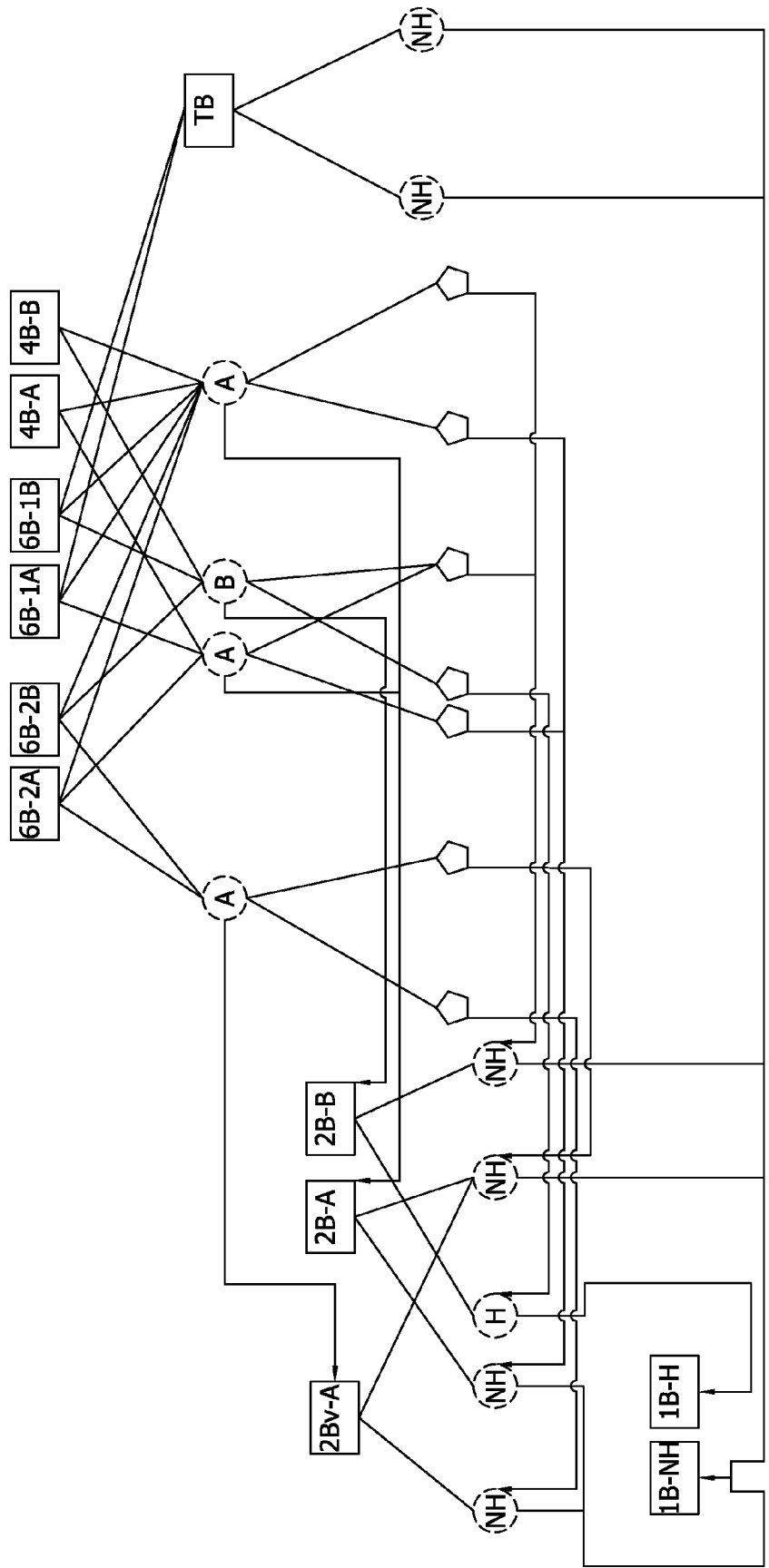
Figure 24:
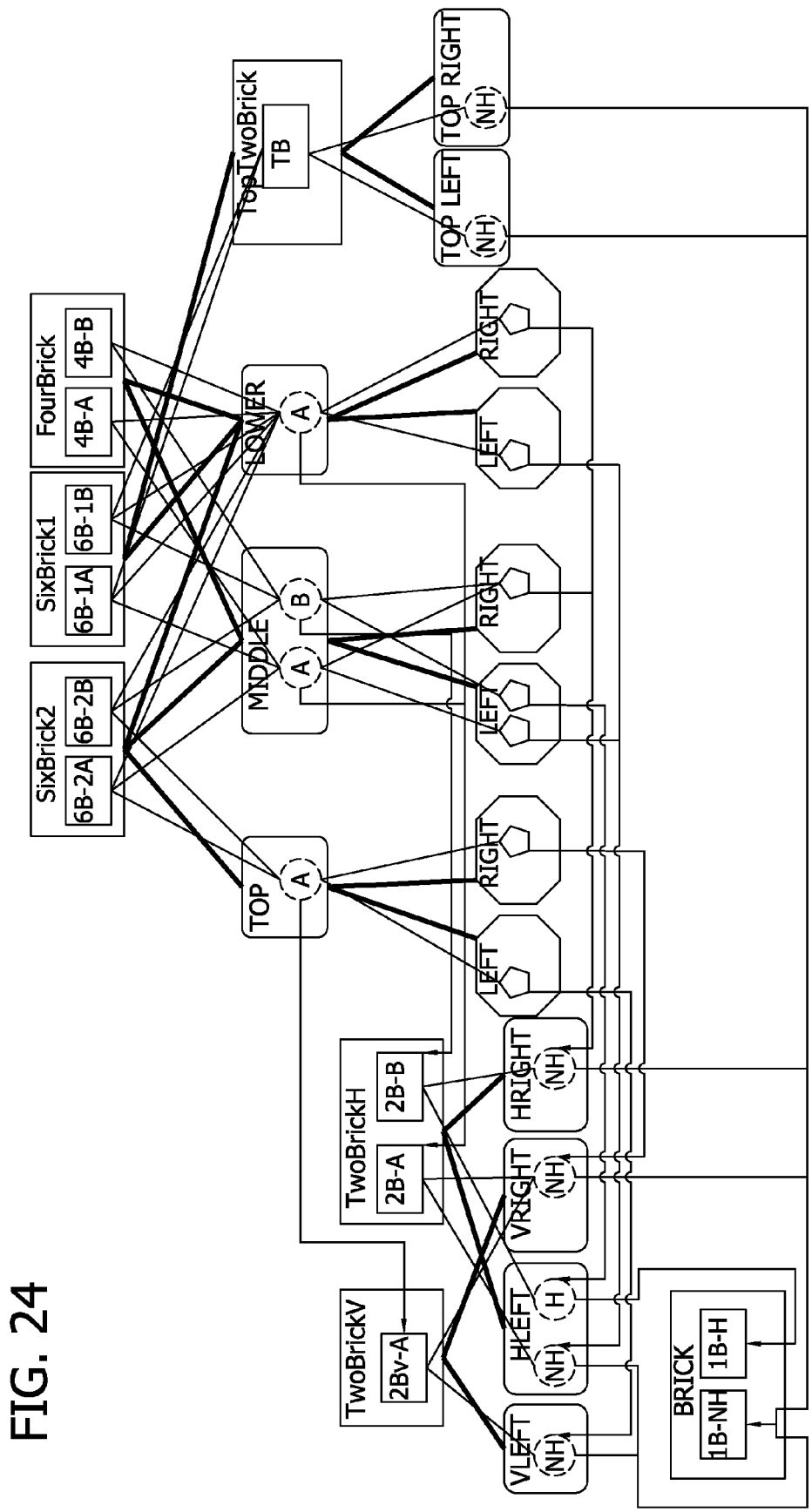
Figure 25:
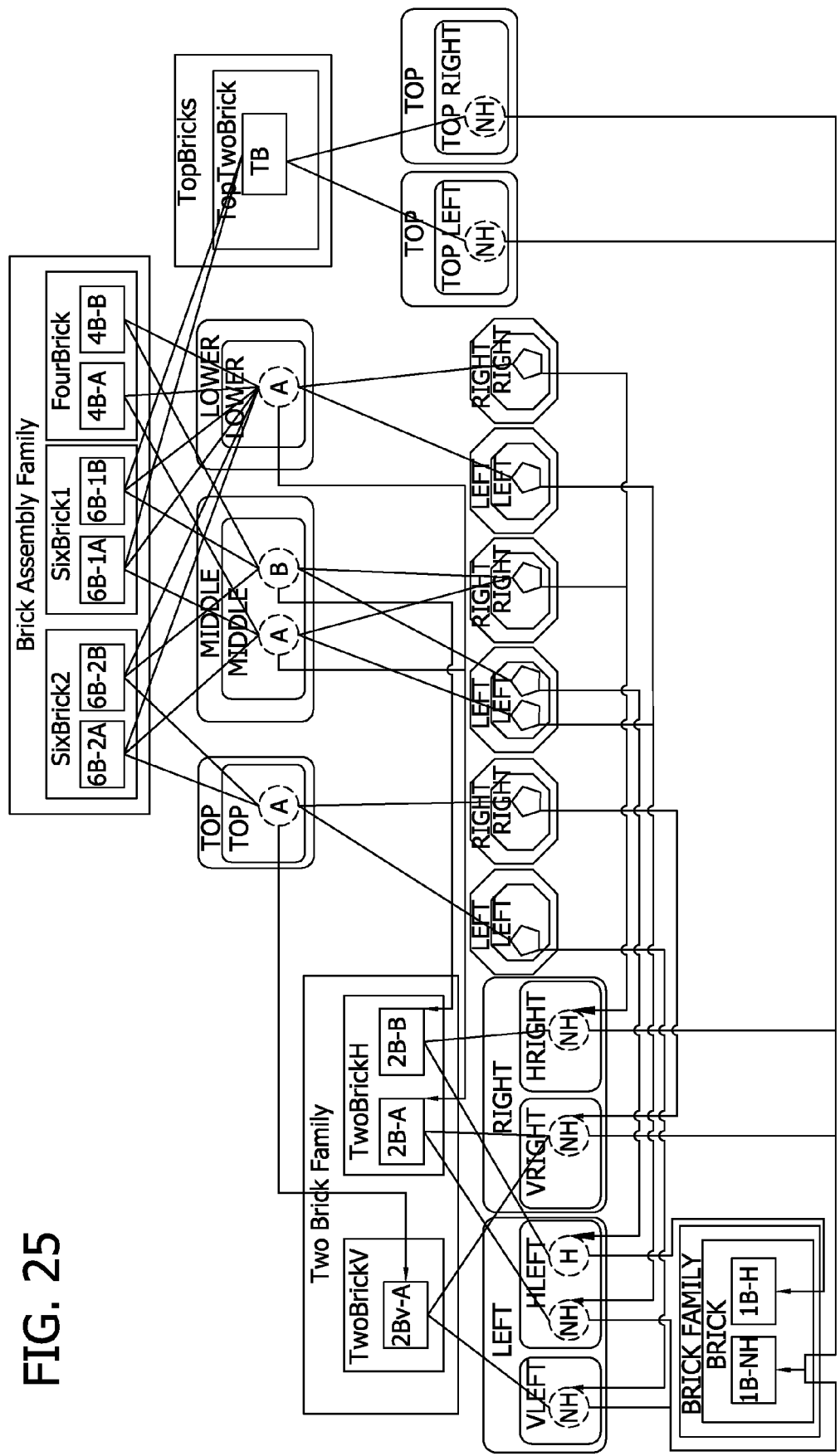

As shown in FIG. 22, all variations that can be selected for the Brick Assembly Family are illustrated. As an example, in the Brick Assembly Family, if SixBrick2 is selected, then a Top, Middle and Lower Brick are selected. Alternatively, if SixBrick1 is selected, then a Middle, Lower, and TopTwoBrick are selected. The nonroot nodes in a configuration tree are referred to as components whereas the nonroot nodes in a template tree are referred to as logical components because they express the fact that there is a requirement for a component in a configuration tree. Any information that is common to all components (configurations) that implement a logical component (template) can be associated with (stored in) that logical component, once, instead of multiple time to each component. FIG. 23 illustrates the six design configurations that can be selected, along with sharing of components between the configurations. FIG. 24 illustrates individual design configurations along with the templates. Again, containment indicates an implements relationship between the contained and containing objects. FIG. 25 illustrates, in combination, the three levels or abstractions of interrelated tree structures that capture logical component structure and actual configuration component structure with all shared design content explicitly represented.

As explained above, managing control of assembly configurations in the presence of assembly structure variations facilitates designing additional variants, improvements, and additional subsystems. Also, distinguishing between structural variations and configuration variations within a fixed structure facilitates avoiding data duplication and data sharing between variations. Further, when a common design changes is made to a design with numerous structural variations, such assembly configuration control facilitates avoiding duplicate work and errors.

In addition, in creating a data model and capturing the generalized product structure, each permitted configuration tree implements, or includes, a certain number of specific components, and no greater or fewer than that number of specific components. Capturing permitted configuration structures in a template tree structure, which is a sub-set of a product tree, facilitates readily identifying potential errors of omission or commission. GEGPS is the combined representation of the single product structure tree and the plurality of template trees and the plurality of configurations trees.

While the invention has been described in terms of various specific embodiments, those skilled in the art will recognize that the invention can be practiced with modification within the spirit and scope of the claims.

What is claimed is:

1. A method of creating product design model instances comprising the steps of:
   creating, within non-transitory computer readable storage medium based on instructions executed by a processing device, a product definition tree that represents permitted elements of a generalized product structure the product definition tree including:
   a plurality of root definition nodes;
   at least one child definition node that is a child of one of said root definition nodes or another said child definition node;
   at least one usage node, each said usage node being a child of one of said root definition nodes or one of said child definition nodes, each said usage node having a reference link to one other of said root definition nodes;

a plurality of occurrence nodes, each said occurrence node being a child of a respective said usage node or a child of one other of said occurrence nodes;

at least one usage subtree, each said usage subtree formed by each said usage node and said occurrence nodes that are direct or indirect children of the respective said usage node;

a plurality of definition trees, each definition tree comprising one of said root definition nodes and all said usage subtrees that are children of the respective said root definition node and all child definition trees that are children of the respective said root definition node, each said usage subtree having a same structure as the definition tree associated with another of said root definition nodes to which said usage node has the reference link, each said child definition tree comprising one of said child definition nodes and all said usage subtrees that are children of the respective one of said child definition nodes and all child definition trees that are children of the respective one of said child definition nodes;

creating, within the non-transitory computer readable storage medium and based on instructions executed by the processing device, a template tree representing a product design structure variant which represents a subset of the product definition tree, the template tree including:

a plurality of root definition template nodes;

at least one child definition template node that is a child of at least one of said root definition template nodes or of at least one of said child definition template nodes;

at least one usage template node, each said usage template node being the child of at least one of said root definition template nodes or one of said child definition template nodes, each said usage template node having a reference link to one other of said root definition template nodes;

a plurality of occurrence template nodes, each said occurrence template node being a child of one or more respective said usage template nodes or a child of one or more other of said occurrence template nodes;

at least one usage template subtree, each said usage template subtree formed by each said usage template node and said occurrence template nodes that are direct or indirect children of the respective said usage template nodes; and a plurality of definition template trees, each definition template tree comprising one of said root definition template nodes and all said usage template subtrees that are children of the respective said root definition template node and all child definition trees that are children of the respective said root definition template node, each said usage template subtree having a same structure as the definition template tree associated with one other of said root definition template nodes to which said usage template node has the reference link, each child definition template tree comprising one of said child definition template nodes and all said usage template subtrees that are children of the respective one of said child definition template nodes and all child definition template trees that are children of the respective one of said child definition template nodes; and storing, using the processing device and into the non-transitory computer readable storage medium, the product definition tree and the template tree.

2. The method of claim 1 wherein the product definition tree represents permitted elements of a generalized product structure, and the template tree defines permitted structures of configuration trees, and said method further comprises creating a plurality of configuration trees, each configuration tree associated with one of said template trees and including:

a plurality of root definition configuration nodes;

at least one child definition configuration node that is a child of at least one of said root definition configuration nodes or at least one of said child definition configuration nodes;

at least one usage configuration node, each said usage configuration node being a child of at least one of said root definition configuration nodes or one of said child definition configuration nodes, each said usage configuration node having the reference link to one other of said root definition configuration nodes;

a plurality of occurrence configuration nodes, each said occurrence configuration node being a child of one or more respective said usage configuration nodes or a child of one or more other of said occurrence configuration nodes;

at least one usage configuration subtree, each said usage configuration subtree formed by each said usage configuration node and said occurrence configuration nodes that are direct or indirect children of the respective said usage configuration nodes; and a plurality of definition configuration trees, each definition configuration tree comprising one of said root definition configuration nodes and all said usage configuration subtrees that are children of the respective said root definition configuration node and all child configuration definition trees that are children of the respective said root definition configuration node, each said usage configuration subtree having a same structure as the definition configuration tree associated with one other of said root definition configuration nodes to which said usage configuration node has the reference link, each said child definition configuration tree comprising one of said child definition configuration nodes and all said usage configuration subtrees that are children of the respective one of said child definition configuration nodes and all child definition configuration trees that are children of the respective one of said child definition configuration nodes.

3. The method of claim 2 wherein at least two template trees share at least one of a usage template node, a template, an occurrence template node, and a child definition template node.

4. The method of claim 2 wherein at least two configuration trees share at least one of a usage configuration node and a child definition configuration node, and wherein said at least two configuration trees further share at least one occurrence configuration node.

5. The method of claim 1 further comprising the steps of creating a first template tree structure, by defining a root template definition node having multiple child nodes.

* * * * *